(12) United States Patent
Leigh et al.

(10) Patent No.: US 10,681,832 B1
(45) Date of Patent: Jun. 9, 2020

(54) HIGH-DENSITY UNIVERSALLY-CONFIGURABLE SYSTEM BOARD ARCHITECTURE WITH DUAL-USE MODULAR MID-BOARD OPTICS (MBOS)

(71) Applicant: Hewlett Packard Enterprise Development LP, Houston, TX (US)

(72) Inventors: Kevin B. Leigh, Houston, TX (US);
Everett Salinas, Houston, TX (US);
Richard Barnett, Houston, TX (US);
Michael Chan, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/433,857

(22) Filed: Jun. 6, 2019

(51) Int. Cl.
| H05K 1/02 | (2006.01) |
| H05K 1/14 | (2006.01) |
| H05K 7/14 | (2006.01) |
| H01L 23/498 | (2006.01) |
| G02B 6/42 | (2006.01) |
| H05K 1/11 | (2006.01) |

(52) U.S. Cl.
CPC .......... *H05K 7/1417* (2013.01); *G02B 6/428* (2013.01); *H01L 23/49816* (2013.01); *H05K 1/0274* (2013.01); *H05K 1/0298* (2013.01); *H05K 1/113* (2013.01); *H05K 1/144* (2013.01)

(58) Field of Classification Search
CPC ..... H05K 1/0274; H05K 1/0298; H05K 1/144
See application file for complete search history.

(56) References Cited

U.S. PATENT DOCUMENTS

| 6,389,202 | B1* | 5/2002 | Delpiano | G02B 6/4214 |
| | | | | 385/14 |
| 6,749,345 | B1* | 6/2004 | Gee | G02B 6/421 |
| | | | | 385/75 |
| 7,466,880 | B2* | 12/2008 | Windover | H04B 10/801 |
| | | | | 385/129 |
| 7,740,488 | B2 | 6/2010 | Taylor | |
| 8,011,933 | B2 | 9/2011 | Ito | |
| 8,491,315 | B1 | 7/2013 | Ramsey et al. | |
| 8,536,512 | B2 | 9/2013 | Shiraishi | |
| 9,360,638 | B2* | 6/2016 | Maetani | G02B 6/423 |
| 9,678,271 | B2 | 6/2017 | Thacker et al. | |
| 9,703,052 | B2* | 7/2017 | Kase | G02B 6/4206 |
| 9,739,939 | B1* | 8/2017 | Quinlan | H04B 10/801 |
| 10,490,511 | B2* | 11/2019 | Sun | H05K 1/0216 |
| 10,520,392 | B1* | 12/2019 | Chen | G02B 6/30 |

(Continued)

*Primary Examiner* — Adrian S Wilson
(74) *Attorney, Agent, or Firm* — Sheppard Mullin Richter & Hampton LLP

(57) ABSTRACT

A high-density universally-configurable system board architecture for use with multiple mid-board optic (MBO) type configurations is provided. The system board comprises a switch application specific integrated circuit (ASIC) assembly, a plurality of MBO interfaces comprising a plurality of via-in-pad plated over (VIPPO) vias, and a plurality of mounting holes. Each MBO interface is configured to mate with a soldered-down MBO assembly or a socket instance comprising a socketized MBO assembly. Each socketized MBO assembly comprises an interposer comprising a plurality of VIPPO vias, where the bottom contact pad of each VIPPO via is thicker than the top contact pad. Either configuration is facilitated without the need to modify the system board layout.

20 Claims, 15 Drawing Sheets

(56) References Cited

U.S. PATENT DOCUMENTS

| | | | |
|---|---|---|---|
| 2005/0156310 A1* | 7/2005 | Benner | G02B 6/4212 |
| | | | 257/712 |
| 2005/0196177 A1* | 9/2005 | Moran | H04B 10/504 |
| | | | 398/182 |
| 2019/0082536 A1 | 3/2019 | Park et al. | |

* cited by examiner

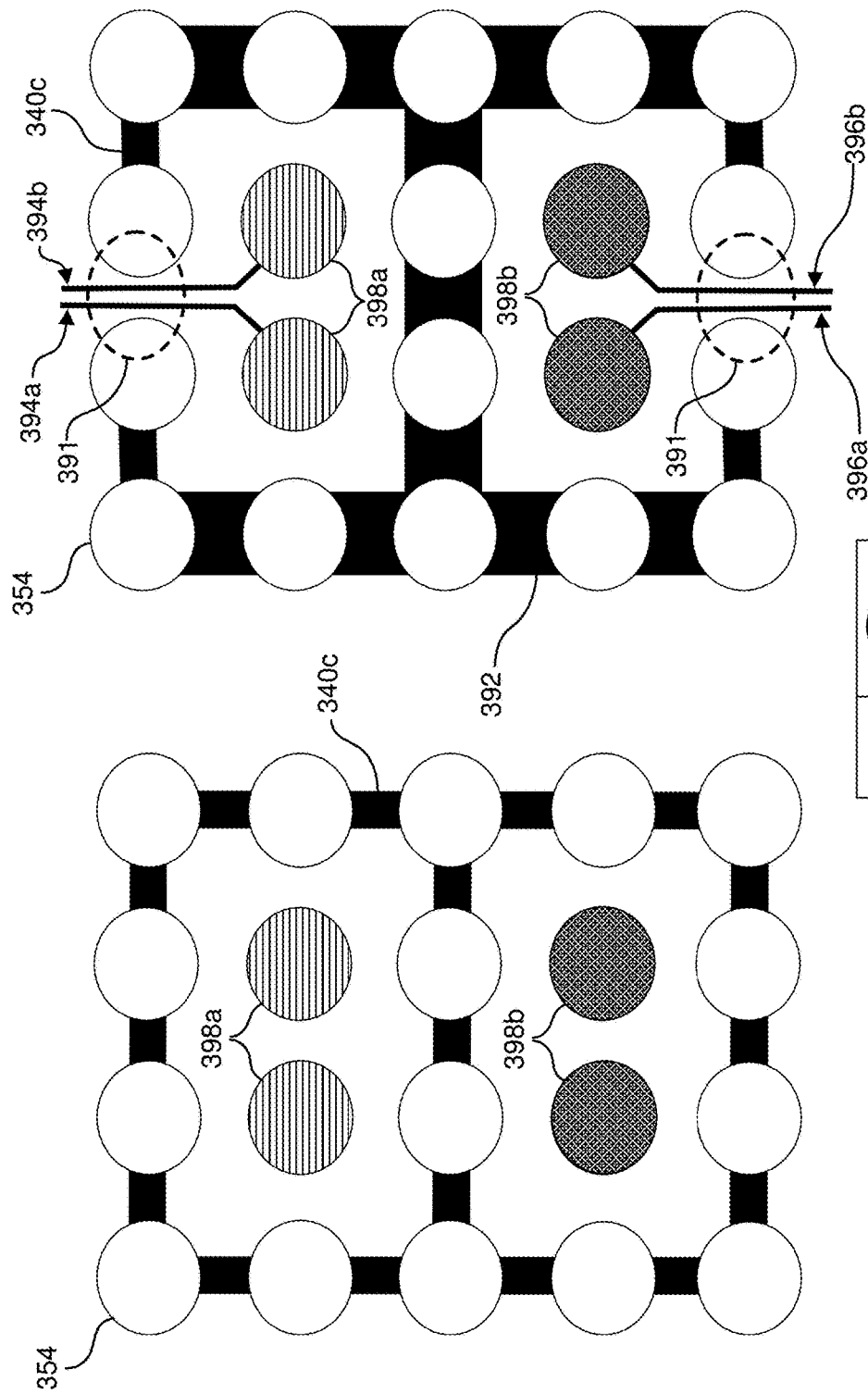

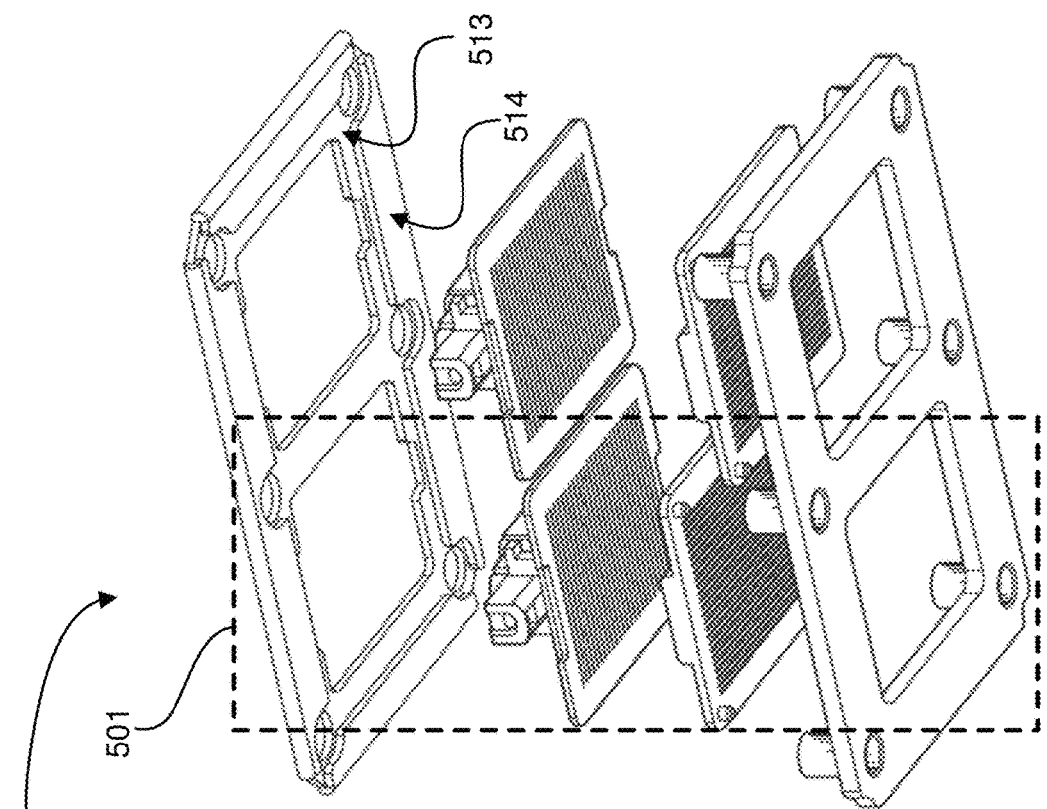
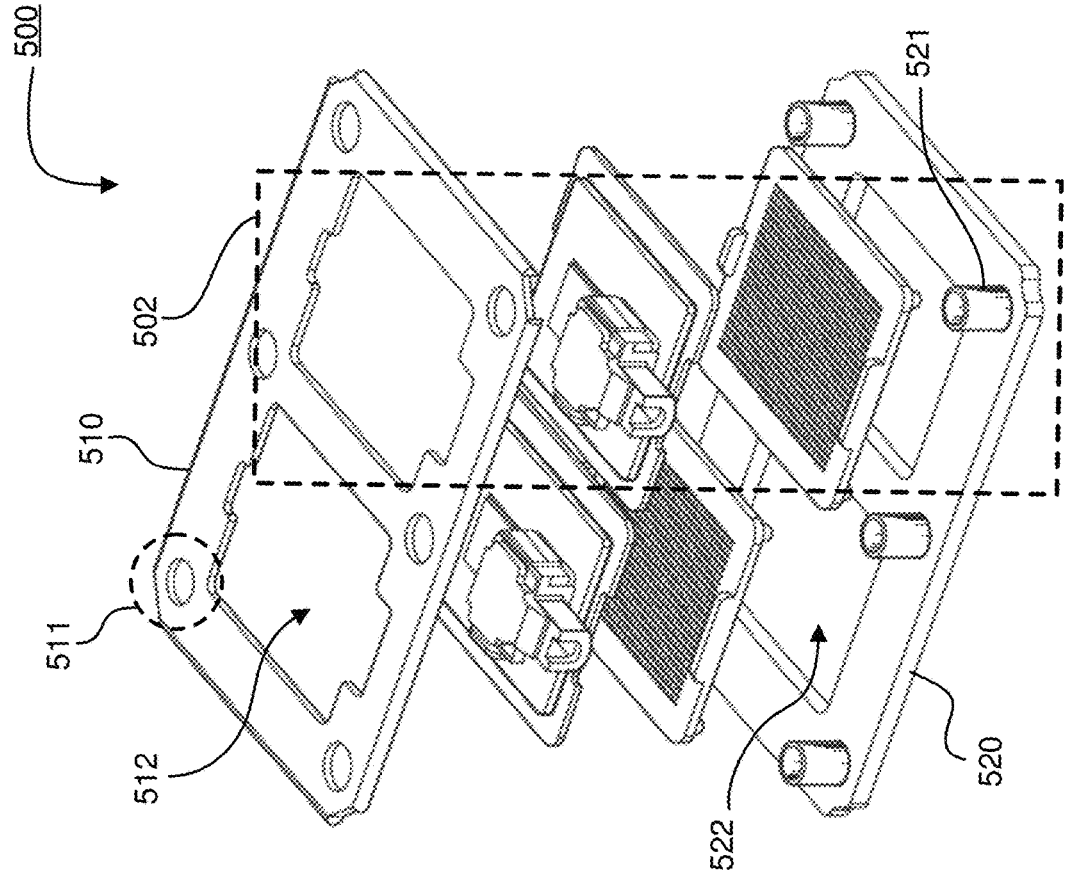
FIG. 5B
FIG. 5A

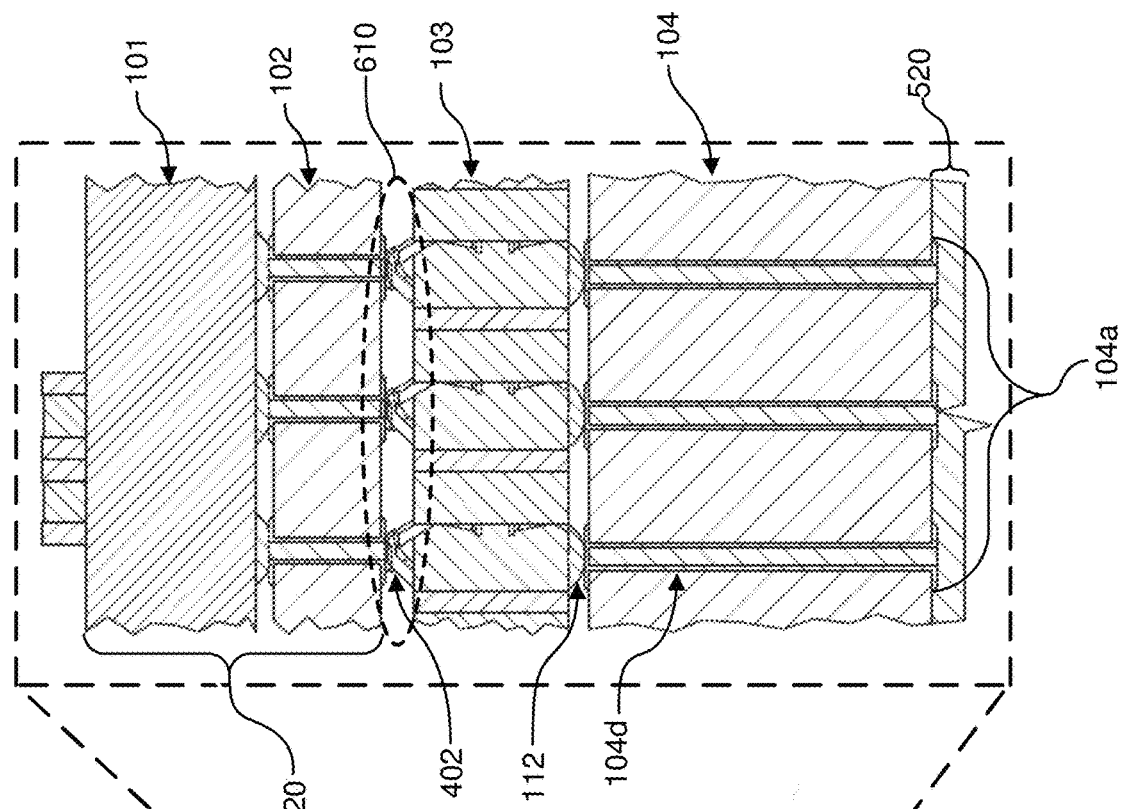
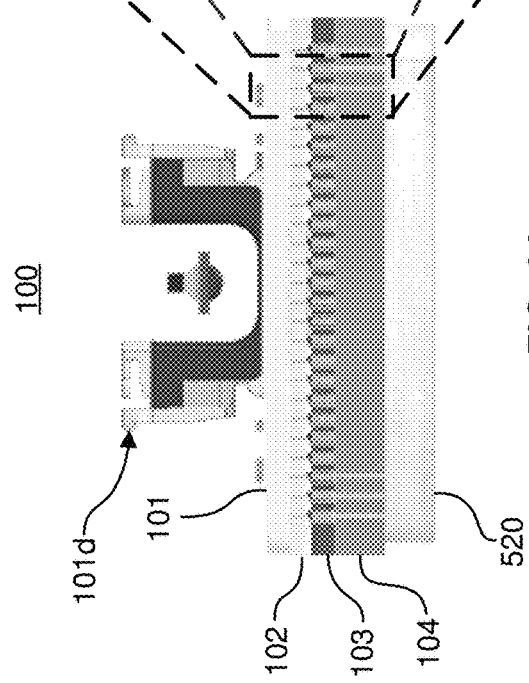
FIG. 6A
FIG. 6B

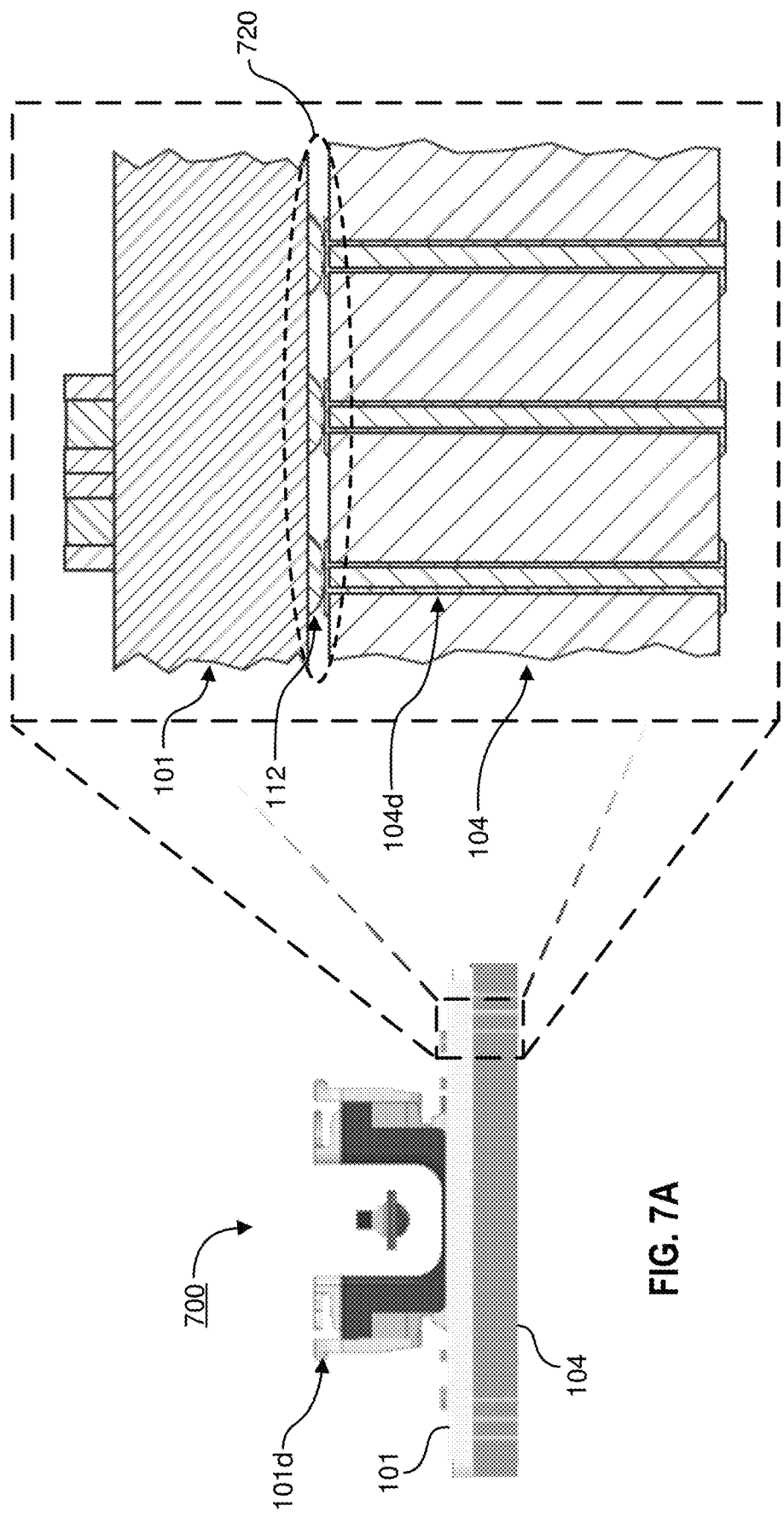

US 10,681,832 B1

HIGH-DENSITY UNIVERSALLY-CONFIGURABLE SYSTEM BOARD ARCHITECTURE WITH DUAL-USE MODULAR MID-BOARD OPTICS (MBOS)

BACKGROUND

Optical communication technology is used in some computing networks to increase the speed and overall bandwidth for communication between different networking devices (e.g., server device to a network router). The optical signals received by such devices are generally converted into electrical signals at the faceplate and routed through the networking device over electrical traces. Optics are increasingly being integrated into networking devices.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Some of the figures included herein illustrate various embodiments of the invention from different viewing angles. Although the accompanying descriptive text may refer to elements depicted therein as being on the "top," "bottom" or "side" of an apparatus, such references are merely descriptive and do not imply or require that the invention be implemented or used in a particular spatial orientation unless explicitly stated otherwise.

FIG. 3E is an example top layer of an example signal VIPPO interconnect configuration in accordance with embodiments of the technology disclosed herein.

FIG. 3F is an example inner layer of an example signal VIPPO interconnect configuration in accordance with embodiments of the technology disclosed herein.

FIG. 5A illustrates an exploded top view of an example socketized MBO system in accordance with embodiments of the technology disclosed herein.

FIG. 5B illustrates an exploded bottom view of the example socketized MBO system of FIG. 5A.

FIG. 6A is a side view of an example socketized MBO configuration when fully constructed in accordance with embodiments of the technology disclosed herein.

FIG. 6B is a cross-sectional view of an excerpted section of the example socketized MBO configuration of FIG. 6A.

FIG. 7A is a side view of an example MBO configuration when fully constructed in accordance with embodiments of the technology disclosed herein.

FIG. 7B is a cross-sectional view of an excerpted section of the example MBO configuration of FIG. 7A.

Figure 1:
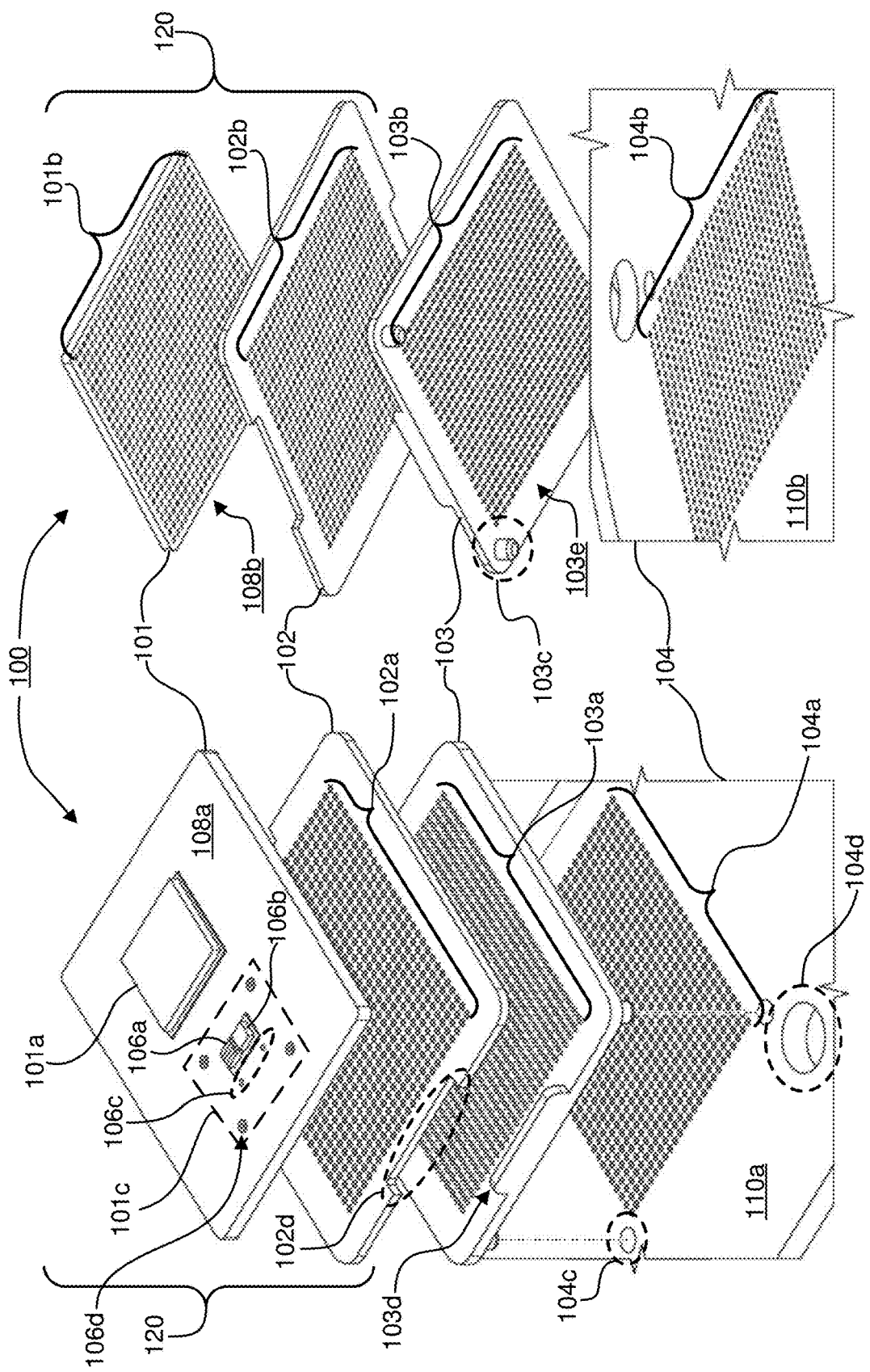
FIG. 1A illustrates an exploded top view of example socketized MBO configuration in accordance with embodiments of the technology disclosed herein.
FIG. 1B illustrates an exploded bottom view of the example socketized MBO configuration of FIG. 1A.

The figures are not exhaustive and do not limit the present disclosure to the precise form disclosed.

DETAILED DESCRIPTION

To improve efficiency and throughput, optics are increasingly being integrated within system devices. Pluggable modules (e.g., quad small form-factor pluggable (QSFP) modules) in the form of optical transceivers provide a conversion point between electrical and optical signals on the system device's faceplate. However, such optical transceiver pluggable modules are generally inefficient in cost, electrical signal integrity, thermal management, module management, printed circuit board (PCB) area utilization, faceplate area utilization, and optical cable management. Moving the optical transceivers, in different form factors than pluggable optical transceivers, closer to processing components within system devices reduces the distance of electrical traces linking the optical transceiver and the processing component, thereby increasing system performance and signal integrity.

However, co-locating optical transceivers with the processing components (e.g., a high-radix switch application specific integrated circuit (ASIC)) on a system board presents issues with respect to configuration and capacity. The different optical transceivers known in the art are too big to simply be packaged on the system board as the switch ASIC. Mid-board optics (MBOs) can be used to alleviate the co-packaged optics issues by providing a line-card with a smaller form factor that can interface with the system board and the switch ASIC. But, MBOs present their own product implementation issues. Soldered-down MBOs may be cost efficient due to fewer parts to install, but limit the flexibility in the choices of optical transceivers which may be included, resulting in difficulty providing a solution for different customer applications.

MBOs can be modularized by using sockets, i.e., socketized MBOs, allowing flexible installation of application-specific optical transceivers. However, socketized MBOs are designed to be used with sockets, and the overhead of socketizing MBOs can be expensive. Different applications may need different types of MBOs, e.g., different wavelength, multi-mode fiber optics for low-cost short-distance applications, single-mode fiber optics for long-distance applications, CWDM (coarse wave-division multiplexed) optics for fewer fiber count, etc. In designing the switch ASIC system board, a choice must be made whether to use MBOs that are soldered-down to the PCB or a modular socketized MBO. A different system board is necessary for the various different types of MBOs available.

Embodiments of the technology disclosed herein provide a universally-configurable system board and dual-use MBO system. Within the present disclosure, "universally-configurable" is used to describe the ability of the system board to be used in a variety of different implementations regardless of the MBO configuration chosen. For example, the universally-configurable system board can be used in an all-soldered MBO configuration, an all-socketized MBO configuration, or one of a plurality of combinations thereof. The dual-use MBO can be implemented in either a soldered-down configuration or a socketized configuration. Unlike current solutions, the same layout of universally-configurable system board is compatible with either the soldered-down MBO assembly, socketized MBO assembly, or both. The dual-use MBOs and the MBO interfaces of the system board have the same electrical footprint, simplifying system board design. Instead of having to select a configuration prior to designing the board, implementing embodiments discussed herein provides flexibility by allowing the system board to be designed independently of the type of MBO device configuration used, reducing costs associated with design. Moreover, by providing a system wherein MBOs for different configurations (i.e., soldered-down or socketized) are functionally interchangeable, the system board design can be optimized, avoiding wasted space on the board and enabling high-density deployments of MBOs on the system board.

As discussed in greater detail below, embodiments in accordance with the present disclosure comprise a universally-configurable system board comprising a plurality of MBO interfaces disposed within the system board. Each MBO interface comprises electrical contacts for interfacing with an MBO assembly, each MBO assembly associated with a particular configuration (i.e., soldered-down or socketized). Each of the components of the various MBO assembly embodiments comprise an electrical interface portion configured to have the same footprint as the electrical contacts of the MBO interfaces of the system board. In this manner, both soldered-down and socketized MBO assemblies may be connected to the same MBO interface in different implementations, allowing for the same system board design to be used regardless of the chosen MBO configuration. In various embodiments, the MBO assembly for a soldered-down configuration may comprise an MBO substrate having a processing component and an optical interface having an optical receptacle connector disposed thereon, the MBO substrate comprising a ball grid array (BGA) device having an electrical interface configured to be soldered-down directly onto the MBO interface. In other embodiments, the MBO assembly for a socketized configuration can comprise the soldered-down MBO assembly (discussed above) disposed on top of an interposer board to create a socketized MBO assembly. In such embodiments, a socket can be disposed on the MBO interface and configured to mate with the interposer board. In various embodiments, the interposer board comprises a via-in-pad platted over (VIPPO) grid array configured to couple to an array of contacts disposed in the socket, providing electrical transmission with increased signal integrity compared to traditional dog-bone style vias.

It should be noted that the terms "optimize," "optimal" and the like as used herein can be used to mean making or achieving performance as effective or perfect as possible. Moreover, techniques disclosed herein can refer to, e.g., performing calculations, etc. that result in "more accurate" determinations. However, as one of ordinary skill in the art reading this document will recognize, perfection cannot always be achieved. Accordingly, these terms can also encompass making or achieving performance as good or effective as possible or practical under the given circumstances, or making or achieving performance better than that which can be achieved with other settings or parameters.

FIGS. 1A and 1B show exploded perspective views illustrating the interaction of example components in accordance with embodiments of the technology disclosed herein. For ease of discussion, FIGS. 1A and 1B illustrate components of an example socketized MBO configuration 100, showing the relationship between the electrical footprints of the various components. As mentioned above, a socketized MBO assembly can comprise an MBO assembly for soldered-down configurations (i.e., a soldered-down MBO assembly 101). For ease of discussion, soldered-down MBO assembly 101 shown in FIGS. 1A and 1B is illustrated without an optical receptacle connector disposed on optical interface 101c. This omission should not be interpreted as limiting the scope of the illustrative embodiments discussed herein, nor does the omission hinder a person of ordinary skill's ability to understand the technology disclosed herein. When soldered-down MBO assembly 101 is used in a soldered-down configuration (not shown in FIGS. 1A and 1B), interposer board 102 and socket 103 would not be present. Further differences between the different configurations shall be discussed in the present disclosure when appropriate. Moreover, to assist in describing the relationship between the electrical footprints of each component, several other components have been omitted from FIGS. 1A and 1B; such omission should not be interpreted as limiting the scope of the subject matter or excluding the omitted components from the disclosure. Elements omitted from FIGS. 1A and 1B shall be discussed with reference to appropriate figures within the present disclosure and should not be interpreted as being incompatible with the example illustration of FIGS. 1A and 1B.

FIGS. 1A and 1B provide an exploded top view and an exploded bottom view, respectively, of example socketized MBO configuration 100. In various embodiments, socketized MBO configuration 100 may include soldered-down MBO assembly 101. As shown, soldered-down MBO assembly 101 may comprise an MBO substrate 108 (having top surface 108a and bottom surface 108b) comprising a processing component 101a and an optical interface 101c. In various embodiments, processing component 101a may comprise one or more components or integrated circuits configured to control operation of soldered-down MBO assembly 101. Non-limiting examples of processing component 101a include logic-gate state-machines, microprocessors, microcontrollers, application-specific integrated circuits (ASICs), field programmable gate arrays (FPGAs), application-specific instruction-set processor (ASIPs), digital signal processor (DSP), signal conditioner, data rate gear box, configuration management processor, among other types of processing components known in the art. In various embodiments, processing component 101a may comprise one or more drivers for controlling the operation of lasers 106a of optical interface 101c, one or more amplifiers for amplifying the converted optical signal received by one or more photodetectors 106b of optical interface 101c, or a combination of both. In various embodiments, the one or more drivers and/or one or more amplifiers may be disposed on MBO substrate 108 between processing component 101a and optical interface 101c. In various embodiments, processing component 101a may comprise one or more electrical transmit differential serdes (serializer/deserializer) for interfacing to the system logic chips' receivers (not shown in FIGS. 1A and 1B), one or more electrical receive differential serdes for interfacing to the system logic chips' transmitters (not shown in FIGS. 1A and 1B), or a combination of both. These electrical transmit and receive serdes are electrically coupled to the electrical interface 101a on the bottom surface 108b of MBO substrate 108. In various embodiments, processing component 101a may further comprise one or more electrical signals for interfacing to the system management controller, and one or more electrical power interface to couple with system power supplies. In various embodiments, processing component 101a may electrically couple to the substrate 108 by means of micro-BGA balls.

In various embodiments, optical interface 101c may comprise an optical receptacle connector (not shown in FIG. 1A). The optical receptacle connector may be configured to couple to one of a variety of different optical fiber connectors, including but not limited to, PRIZM light-turn (PLT) for single-wavelength optical signals, PRIZM mechanical transfer (PMT) for single-wavelength optical signals, coarse wave division multiplexed (CWDM) with wavelength filters for multi-wavelength optical signals among other connector types known in art, including variations thereof. In various embodiments, optical interface 101c may be configured to transmit and/or receive single-mode or multi-mode optical signals. The optical receptacle connector of optical interface 101c may be configured to enable optical fiber connectors to be removable in some embodiments.

As illustrated in FIG. 1B, soldered-down MBO assembly 101 includes an electrical interface 101b. As illustrated, electrical interface 101b comprises a ball grid array (BGA) of solder balls. In various embodiments, electrical interface 101b can have a variety of different solder ball sizes, solder ball size pitches, or a combination thereof. For ease of discussion, the technology of the present disclosure will be described with reference to the soldered-down MBO assembly 101, as depicted in FIG. 2. The diagram in FIG. 2 is provided for illustrative purposes only and should not be interpreted as limiting the subject matter of the present disclosure to only the illustrated embodiment. Where references used to identify elements are common between different figures it should be interpreted that discussions with respect to the common reference number in any figure apply equal to all other instances of the reference.

Referring to FIG. 2, soldered-down MBO assembly 101 is shown with an optical fiber connector 101d coupled to the optical receptacle connector 101e attached to the optical interface 101c. Current MBO solutions require an additional fiber jumper where one end of the fiber jumper has an optical ferrule which is actively aligned and affixed to optical interface 101c to optically couple with lasers 106a and photodetectors 106b, while the other end of the fiber jumper has an optical receptacle connector to allow optical cables to be modularly attached to. For a current soldered-down MBO, this jumper fiber is required to be in place after the MBO assembly is soldered-down, since optical fibers are not capable of withstanding the thermal heat associated with the solder reflow process. In addition, optical fibers and ferrules of the fiber jumper have to be type-matched to the lasers 106a and photodiodes 106b. This is another reason current MBO assemblies must be predetermined and are inflexible because the method of construction must be tailored to the specific type of MBO used. Unlike current MBO solutions, soldered down MBO assembly 101 does not require a fiber jumper. The optical receptacle connector 101e has complementary auto-alignment features to the alignment features 106d of the optical interface 101c such that when the optical receptacle connector 101e is soldered down directly, after being auto-aligned, on the MBO substrate 108, the optical receptacle connector 101e provides a mechanical environment for the optical fiber connector 101d to be modularly installed in the optical receptacle connector 101e and allows proper optical signal alignment between the optical connector 101d and lasers 106a as well as photodetectors 106b. Embodiments in accordance with the present disclosure alleviate the need for such fiber jumper, thereby allowing to be solder reflowed, improving optical signal performance, lowering assembly cost, and facilitating the universality of the different MBO configurations. In various embodiments, connector alignment features 106d of optical interface 101c can be used to align the removable optical fiber ferrule (e.g., optical fiber connector 101d) when inserted into optical receptacle connector 101e. As can be seen in the cutout view 200 of FIG. 2, MBO substrate ball array 101b comprises a plurality of solder balls 112 disposed across a bottom surface 108b of the substrate 108.

As illustrated in FIGS. 1A and 1B, MBO substrate ball array 101b has the same electrical footprint as MBO interface 104a of system board 104 (i.e., system board contacts 104a). In soldered-down implementations (not shown), soldered-down MBO assembly 101 may be directly coupled to system board contacts 104a (discussed below with respect to FIG. TBD).

Figure 3A:
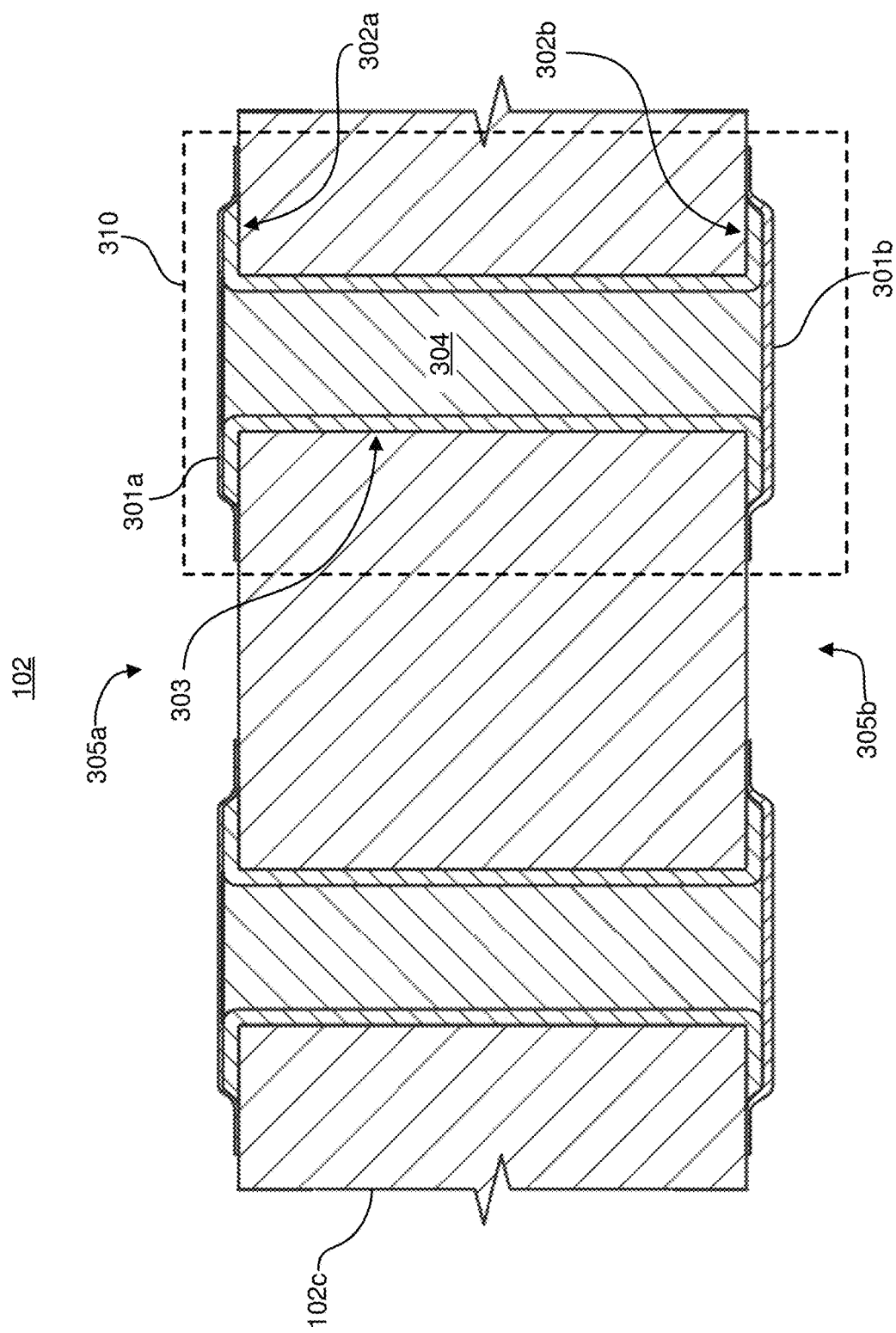
FIG. 3A is a cross-sectional view of an example interposer in accordance with embodiments of the technology disclosed herein.

In socketized MBO configuration 100, soldered-down MBO assembly 101 is configured to couple to interposer board 102. An interposer board is an electrical interface routing between to connections. In various embodiments, interposer board 102 may comprise a via grid array 102a configured to couple to MBO substrate ball array 101b of soldered-down MBO assembly 101. As shown in FIG. 3A, interposer board 102 comprises an interposer board 102c in which top-side via grid 102a and bottom-side via grid 102b are disposed. FIG. 3A also illustrates an example cross-sectional view of VIPPO vias 310 of via grid array 102a, 102b. Via-in-pad plated over (VIPPO) technology helps reduce the amount of space needed for other types of via techniques (e.g., dog-bone vias). Rather than having the contact pad for connection to a device on an adjacent side of the via, such as a dog-bone via, contact pad 301a is plated over directly on top of via pad 302a on the top surface 305a of interposer board 102. The via pad 302a is electrically connected to via pad 302b disposed on the bottom surface 305b of interposer board 102 by a conductive through-via barrel 303. The inner cavity of the conductive through-via barrel 303 may be filled with via fill 304. In various embodiments, via fill 304 may be a type of non-conductive epoxy. In other various embodiments, via fill 304 may be a type of conductive epoxy. Although not shown in FIG. 3, buried vias may be dispersed within inner layers of interposer board 102 to interconnect through-via barrels to conjoin through-via barrels that serve the same purpose (e.g., a power supply rail), or for rerouting of electrical signals in accordance with the requirements of a given implementation. A contact pad 301b is plated over via pad 302b. Contact pads 301a, 301b, via pads 302a, 302b, and conductive via barrel 303 may comprise any suitable conductive material known in the art, including but not limited to copper.

Figure 3B:
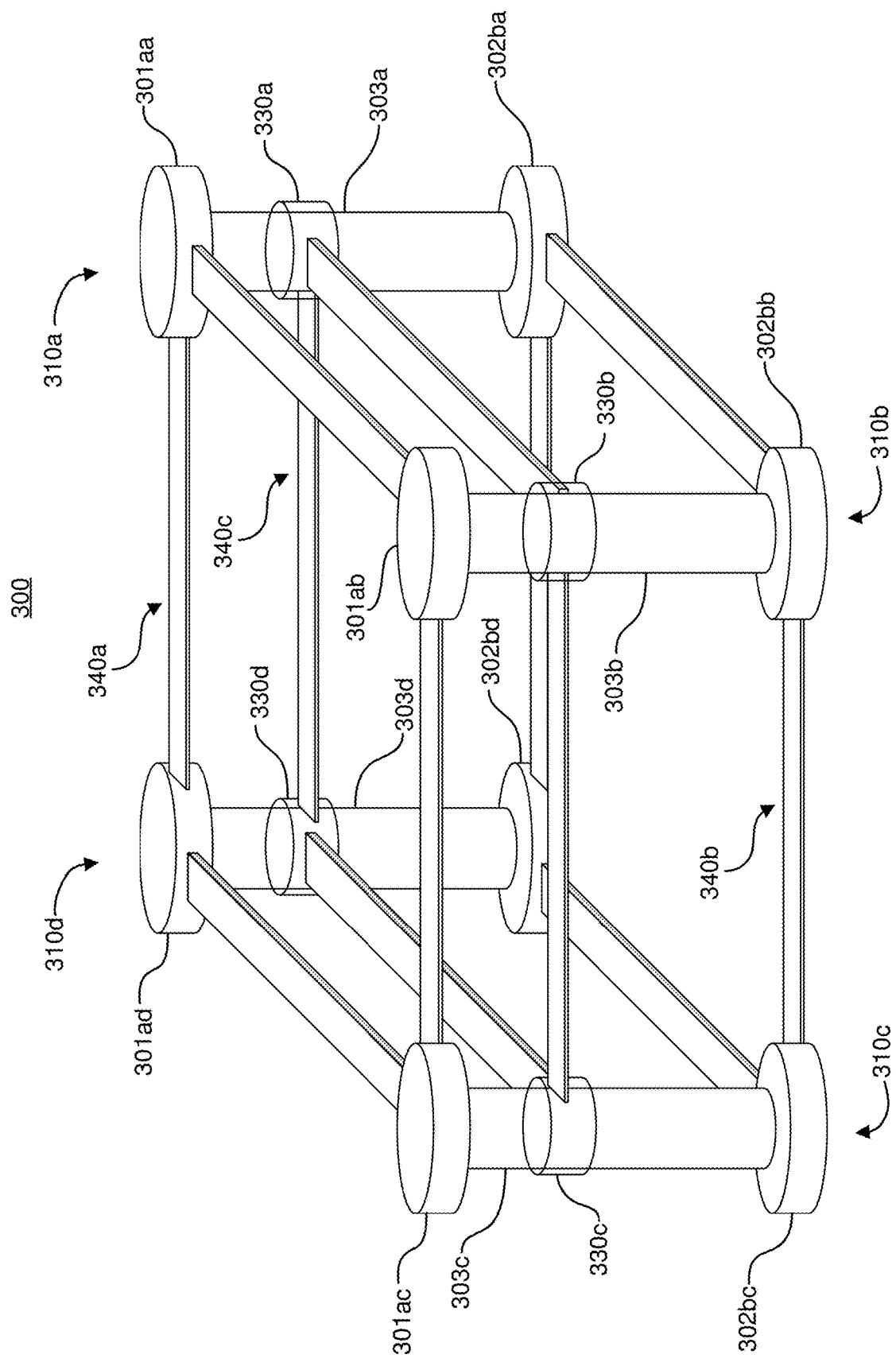
FIG. 3B is an example shunting configuration for tying together vias in accordance with embodiments of the technology disclosed herein.

Use of VIPPO vias 310 can minimize impedance variations through interposer board 102, and in turn can reduce insertion and reflection losses for high-speed signals traveling through vias 310. Reducing these undesired signal loss effects increases signal performance and integrity. In various embodiments, signal performance can be further improved by tying together VIPPO ground vias that surround VIPPO signal vias within the interposer 310. For example, a group of VIPPO vias 310a, 310b, 310c, 310d may be interconnected or shunted. FIG. 3B illustrates an example shunting configuration 300 in accordance with embodiments of the present disclosure. For ease of discussion, FIG. 3B shows the internal relationship of the shunted groups of VIPPO vias 310 within shunted configuration 300, omitting other VIPPO vias within the shunted groups of VIPPO vias 310, interposer board 102b, and the contact pads discussed with respect to FIG. 3A. A person of ordinary skill in the art would understand that implementations of shunted configuration 300 would include some or all of the elements discussed with respect to FIG. 3A. The simplified illustration of FIG. 3B is provided for illustrative purposes only.

As shown in FIG. 3B, buried vias or shunt contacts 330a, 330b, 330c, 330d can be coupled to conductive via barrels 303a, 303b, 303c, 303d. Shunt contacts 330a, 330b, 330c, 330d can be disposed within the interposer board (not shown in FIG. 3B). In various embodiments, shunt contacts 330a, 330b, 330c, 330d can be formed as part of conductive via barrels 303a, 303b, 303c, 303d, while in other embodiments shunt contacts 330a, 330b, 330c, 330d can be separate electrical contact elements disposed in the interposer board and configured to contact conductive via barrels 303a, 303b, 303c, 303d. Electrical traces 340a connect each top via pad 301aa, 301ab, 301ac, 301ad to each other. Similarly, electrical traces 340b connect each bottom via pad 302ba, 302bb, 302bc, 302bd to each other, and electrical traces 340c connect shunt contacts 330a, 330b, 330c, 330d to each other within the inner layer of interposer board.

Figure 3C:
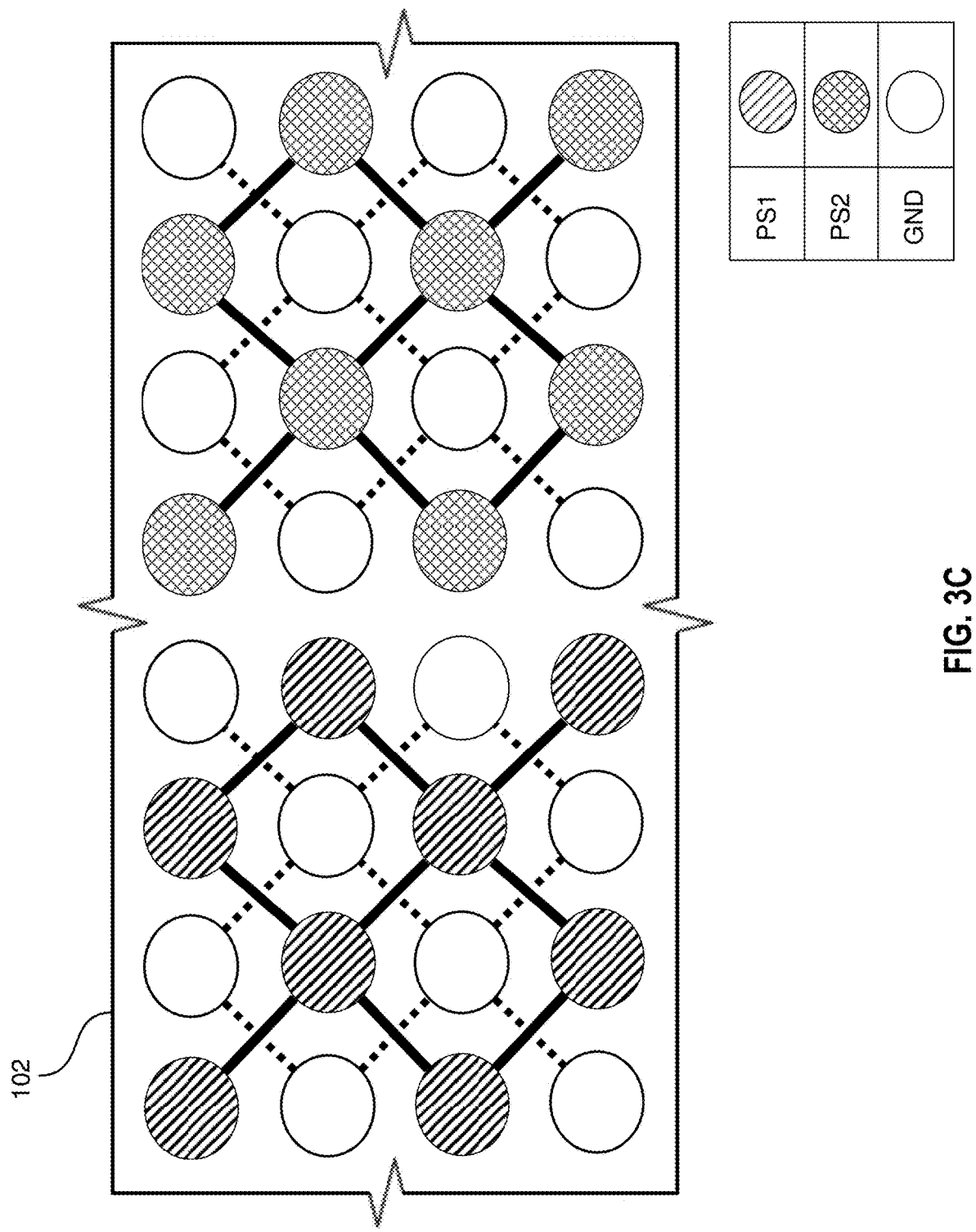
FIG. 3C is an example multiple-shunting configuration in accordance with embodiments of the technology disclosed herein.

In various embodiments, a number of shunt configurations 300 may be used within the interposer board to connect groups of VIPPO vias 310 together. A non-limiting example of multiple shunt configurations is illustrated in FIG. 3C. A legend is provided identifying whether a VIPPO via is grouped with a first power supply (PS1), a second power supply (PS2), or ground (GND). As shown in FIG. 3C, a first set of VIPPO vias of interposer board 102 serve as power supply connections for PS1, while a second set of VIPPO vias serve as power supply connections for PS2. In this way, the heat generated in the conductive via barrels 303 when high currents flow through can be more controllably dispersed for those VIPPO vias serving power to areas of interposer 102. As a non-limiting example, PS1 can be used to power an electrical transceiver, with the first set of VIPPO vias configured to route power to the electrical transceiver, while PS2 can be used to power an optical transceiver though the second set of VIPPO vias. In various embodiments, the ground vias GND can be optionally shunted together (as illustrated by the broken lines in FIG. 3C).

Figure 3D:
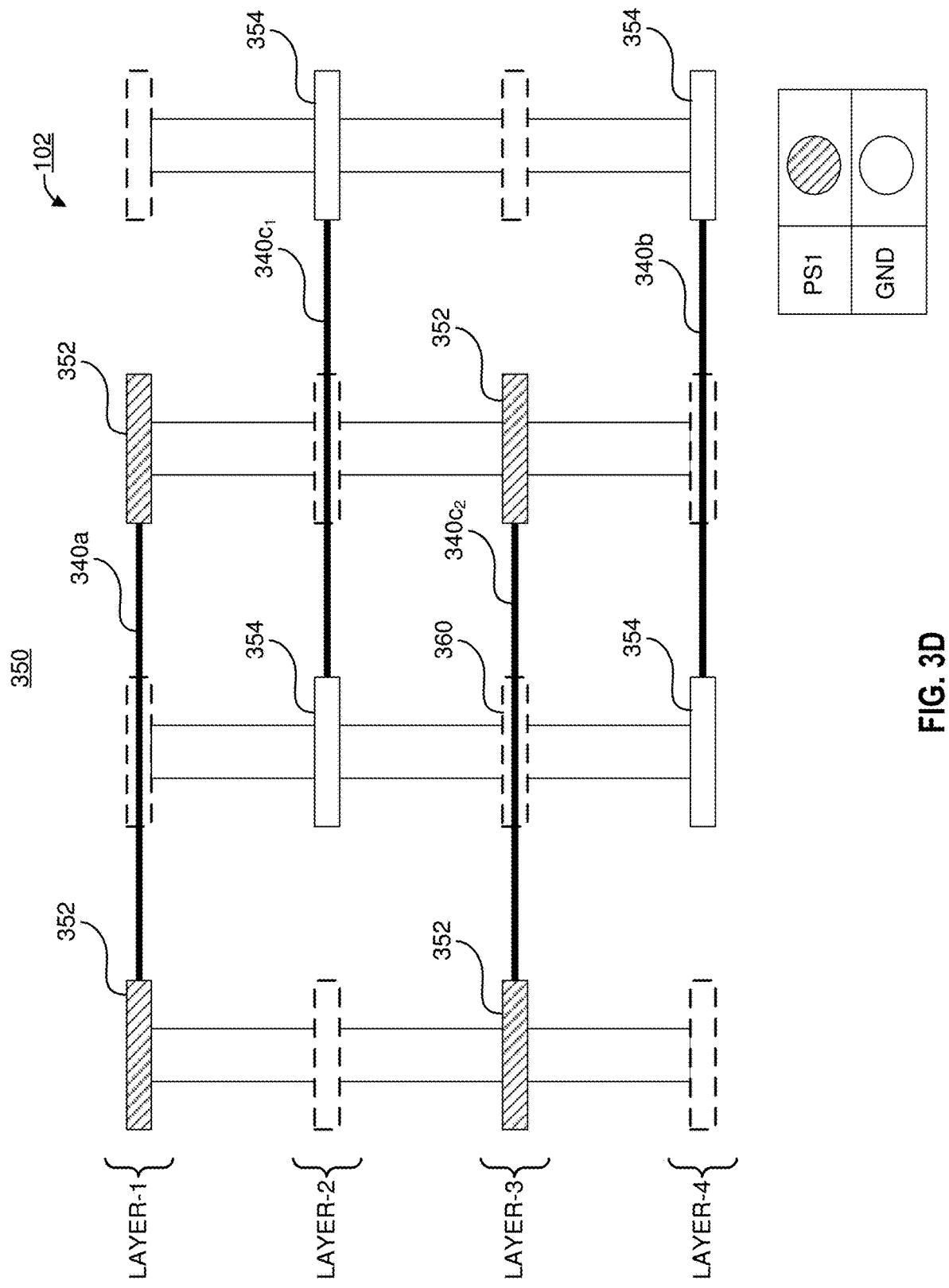
FIG. 3D is an example cross-sectional view of an example interposer board in accordance with embodiments of the technology disclosed herein.

The shunting groups can be electrically coupled together on different layers of the PCB. FIG. 3D illustrates an example interposer layers 350 in accordance with embodiments of the present disclosure. Although interposer layers 350 shows only four layers, in various embodiments additional layers may be included within interposer board 102 depending on the requirements of a given implementation without changing the principle operation of the technology disclosed herein. Moreover, for ease of discussion, interposer layers 350 is discussed with respect to the PS1 shunted group and the GND shunted group of FIG. 3C. This should not be interpreted as limiting the scope of the embodiments disclosed herein to only such an arrangement.

As shown in FIG. 3D, interposer board 102 comprises four layers (LAYER-1, LAYER-2, LAYER-3, LAYER-4). Utilizing the different layers enables multiple traces to be routed through interposer board 102 in a more efficient manner (e.g., crossing over traces). In interposer layout 350, PS1 pads 352 are disposed in LAYER-1 and LAYER-3, each PS1 pad 352 being electrically connected by electrical traces 340a in LAYER-1, and electrically connected by electrical traces $340c_2$ in LAYER-3. Each GND pad 354 is disposed in LAYER-2 and LAYER-4, electrically connected by electrical traces $340c_1$ in LAYER-2 and electrical traces 340b in LAYER-4.

In various embodiments, shunting can be used to minimize crosstalk between signals. FIGS. 3E and 3F illustrate an example top layer 380 and an example inner layer 390 in accordance with embodiments of the technology disclosed herein. FIGS. 3E and 3F are provided for illustrative purposes only, and should not be interpreted as limiting the scope of the technology. In various embodiments, top layer 380 includes electrical traces 340c, shunting the GND pads 354. In this way, signals SIG1, SIG2 respectively represented by signal VIPPOs 398a, 398b are surrounded by GND on the top surface. In this way, crosstalk between SIG1 and SIG2 is minimized. The signal traces 394a, 394b, 396a, 396b can be routed in inner layer 390 through gaps 391 between the shunted GND pads 354. In this way, the signal traces can be coupled to the respective signal VIPPO 398a, 398b. In various embodiments, wide traces 392 can be used to connect GND pads 354 to allow for better cross-talk isolation.

Figure 3G:
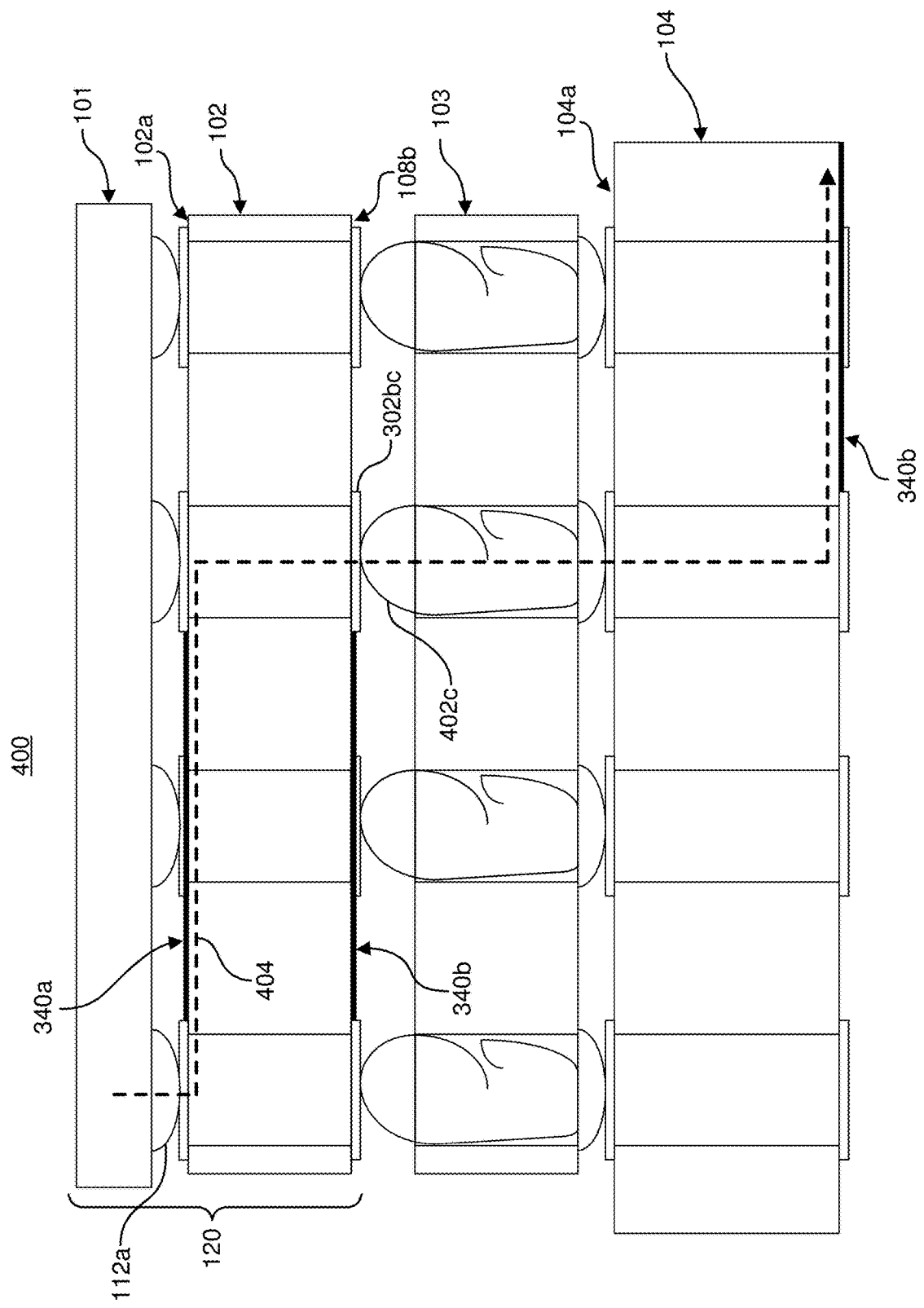
FIG. 3G is an example offset signal configuration in accordance with embodiments of the technology disclosed herein.

In various embodiments, the different signal traces may interconnect signal VIPPOs. However, in some embodiments, a signal may be replicated on multiple pads on system board 104 to be routed to different areas of system board 104, such as control signals. In some other embodiments, it may be difficult to route signals from the inner area to the outer area of MBO interface 104a on system board 104. This could be due to the ball pitch used for solder balls 112 of soldered-down MBO assembly 101, or due to the signal design of system board 104 requiring inner signals of the socketized MBO assembly 120 to be routed to an area of system board 104 requiring a large electrical trace. FIG. 3G illustrates an example offset signal configuration 400 in accordance with embodiments of the present disclosure. As shown, electrical traces 340a, 340b can be used to connect a number of VIPPO vias of interposer board 102. In this way, electrical signal 404 (which is output on solder ball 112a) can be routed from an inner area of interposer board 102 such that it is output from socketized MBO assembly 120 on via pad 302bc to spring contact 402c of socket 103. Therefore, electrical signal 404 is transmitted to system board 104 closer to an outer area of MBO interface 104a. This can reduce the difficulty of routing signals from an inner area to an outer area, reducing the number of inner layers of system board 104 that need to be electrical connected to route the signal where needed on system board 104.

Referring back to FIG. 3A, contact pad 301b on the bottom surface 305b could be thicker (0.0005 in.) than the corresponding contact pad 301a on the top surface 305a of the interposer board 102. Using a thicker (0.001 in.) contact pad 301b provides sufficient structural support to the VIPPO via 310 to withstand the mating force caused by the spring contacts or other non-soldered contacts which may be used. Most uses of VIPPO technology has focused on enabling high density for soldered-down implementations, such as attaching capacitors or other circuit components in a higher density manner. As the components are soldered down, there is no mating or resistive force applied to the contact pad. However, components designed for detachability (rather than affixed, e.g., soldered) generally have coupling configurations where one or more components are applying a mating force on another component. In such situations, openings within conductive via barrels 303 need to be filled 100% with fill material to avoid via-pad collapse (also known as "dimples"). Implementations in accordance with the present disclosure reduce the impact of dimples by utilizing a thicker (0.001 in.) contact pad 301b. As a non-limiting example, contact pad 301a may be 0.0005 in. thick, while contact pad 301b may be 0.0012 in. thick, enabling contact pad 301b to be better equipped to withstand the mating force caused by a force contact (e.g., spring contact). In various embodiments, contact pad 301a may also have a greater thickness than illustrated in FIG. 3. In various embodiments, contact pad 301a can comprise a different material than contact pad 301b. As a non-limiting example, contact pad 301a can comprise an organic surface protectant or other material or film utilized in capping VIPPO vias in the art, while contact pad 301b can comprise an electroplated nickel/gold cap.

As discussed above, interposer board 102 is configured to couple to soldered-down MBO assembly 101. Specifically, top surface 305a of interposer board 102 is configured to couple to bottom surface 108b of soldered-down MBO assembly 101. In various embodiments, each of the plurality of VIPPO vias 310 may be configured to couple with one of the plurality of solder balls 112 of the electrical interface 101b. Once connected, interposer board 102 will be capable of routing electrical signals from soldered-down MBO assembly 101 from contact pad 301a through VIPPO via 310 by conductive via barrel 303 from via pad 302a to via pad 302b.

Referring back to FIGS. 1A and 1B, in various embodiments, interposer board 102 may comprise one or more assembly alignment features 102b. In various embodiments, assembly alignment features 102d may be disposed on one or more sides of interposer board 102. Assembly alignment features 102d may assist in ensuring the bottom surface 305b of interposer board 102 is properly aligned with the socket contact array 103a of socket 103. Specifically, the assembly alignment features 102d ensure the alignment of a reference pin (A1) of the BGA package and the socket, as well as one-to-one alignment between interposer electrical interface 102b and socket contact array 103a. In BGA devices, the different solder balls are assigned with a row and column designation for orientation. As a non-limiting example, letters may represent the row and numbers may represent the columns, resulting in an alpha-numeric designation for each solder ball (e.g., A1, C22, etc.) Accordingly, assembly alignment features 102d can be configured to ensure that the reference pin A1 is properly aligned with the corresponding socket contact of socket contact array 103a. Assembly alignment feature 102d illustrated in FIGS. 1A and 1B comprises a cutout configured to mate to a corresponding assembly alignment protrusion 103d of socket 103. In other embodiments, assembly alignment feature 102d may comprise one or more protrusions with different sizes configured to mate with corresponding receptacles disposed on socket 103 (not shown in FIG. 3). Utilizing different sizes for each of the multiple assembly alignment features in such embodiments ensures that the reference pin (A1) is properly aligned.

Socket contact array 103a comprises a plurality of socket contacts. The type of socket contact can vary between implementations. In some embodiments, each socket contact may comprise a single-spring-type contact, a dual-spring-type contact, an elastomeric contact, or other contact type known in the art and compatible for socket implementations (i.e., suitable for modular connection/disconnection). Utilizing such socket contacts enables the socketized MBO assembly 120 to be detachable from socket 103, enabling flexibility and easier setup.

Figure 4:
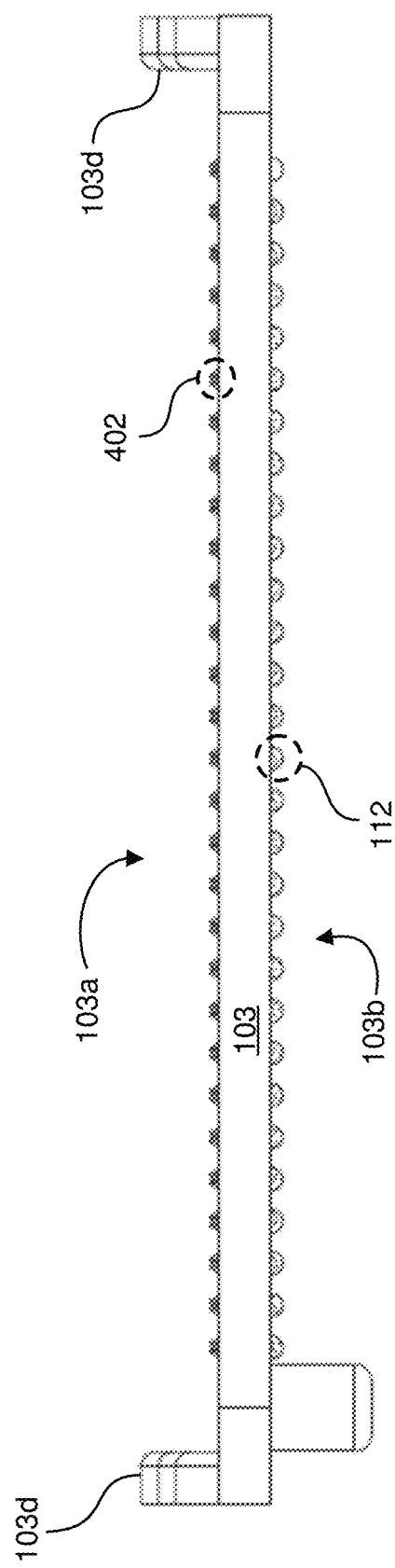
FIG. 4 is a side view of an example socket in accordance with embodiments of the technology disclosed herein.

To allow both soldered-down and socketized configurations in accordance with the technology disclosed herein, the bottom or underside of socket 103 comprises a plurality of solder balls. FIG. 4 shows a profile view of an example socket 103 in accordance with embodiments of the present disclosure. As shown, a plurality of solder balls 112 are disposed in the socket contact ball array 103b of the socket 103. As discussed above, interchangeability between a soldered-down configuration and a socketized configuration is facilitated by utilizing a common electrical footprint between the different components discussed herein. By including socket contact ball array 103b, the same MBO interface 104 can be connected either to the MBO assembly for a soldered-down configuration (having MBO substrate ball array 101b) or socket 103 for a socketized configuration (using socket contact ball array 103b). In various embodiments, socket contact 402 can be a different type of contact type as solder balls 112 of socket contact ball array 103b. As illustrated, socket 103 comprises a socket contact array 103a comprises a plurality of spring-type contacts 402, each spring-type contact 402 associated with a corresponding solder ball 112 of socket contact ball array 103b. The plurality of spring-type contacts 402 protrude up from the socket contact array 103a of socket 103, and a corresponding solder ball 112 is disposed in socket contact ball array 103b of socket 103 and configured to couple to MBO interface 104a of system board 104.

Referring back to FIGS. 1A and 1B, socket 103 is configured to mate with MBO interface 104a of system board 104. Socket 103 includes one or more socket alignment features 103c disposed on the bottom surface of socket 103. Each socket alignment feature 103c may be configured to mate with a corresponding MBO alignment feature 104c disposed on system board 104. In various embodiments, socket alignment features 103c may comprise one or more protrusions extending out from bottom surface 103e of socket 103, as illustrated in FIGS. 1A and 1B, and corresponding MBO alignment features 104c disposed on a top side 110a may comprise one or more holes configured such that the socket alignment features can enter. In other embodiments, socket alignment features 103c may be similar to assembly alignment protrusion 103d discussed above, and MBO alignment features 104c may be notches or channels configured to accept each socket alignment feature 103c. A person of ordinary skill in the art would understand that socket alignment features 103c and MBO alignment features 104c may be one of a variety of different shapes and configurations and are implementation and design preference dependent, and the illustrative example should not be interpreted in limiting the coupling relationship and configuration of the alignment features.

System board pad array 104b is disposed on a bottom surface 110b of system board 104. System board pad array 104b can comprise a plurality of electrical connections (e.g., the bottom of a VIPPO or dog-bone via) associated with MBO interface 104a. System board pad array 104b can be used to mount decoupling capacitors, route traces from other system board pad arrays 104b of other MBO interfaces 104a or pads of other system board 104 components, among other uses. In addition, interconnected buried vias (not shown)

may be present within system board 104 corresponding to each of the system board pad arrays 104b.

Figure 2:
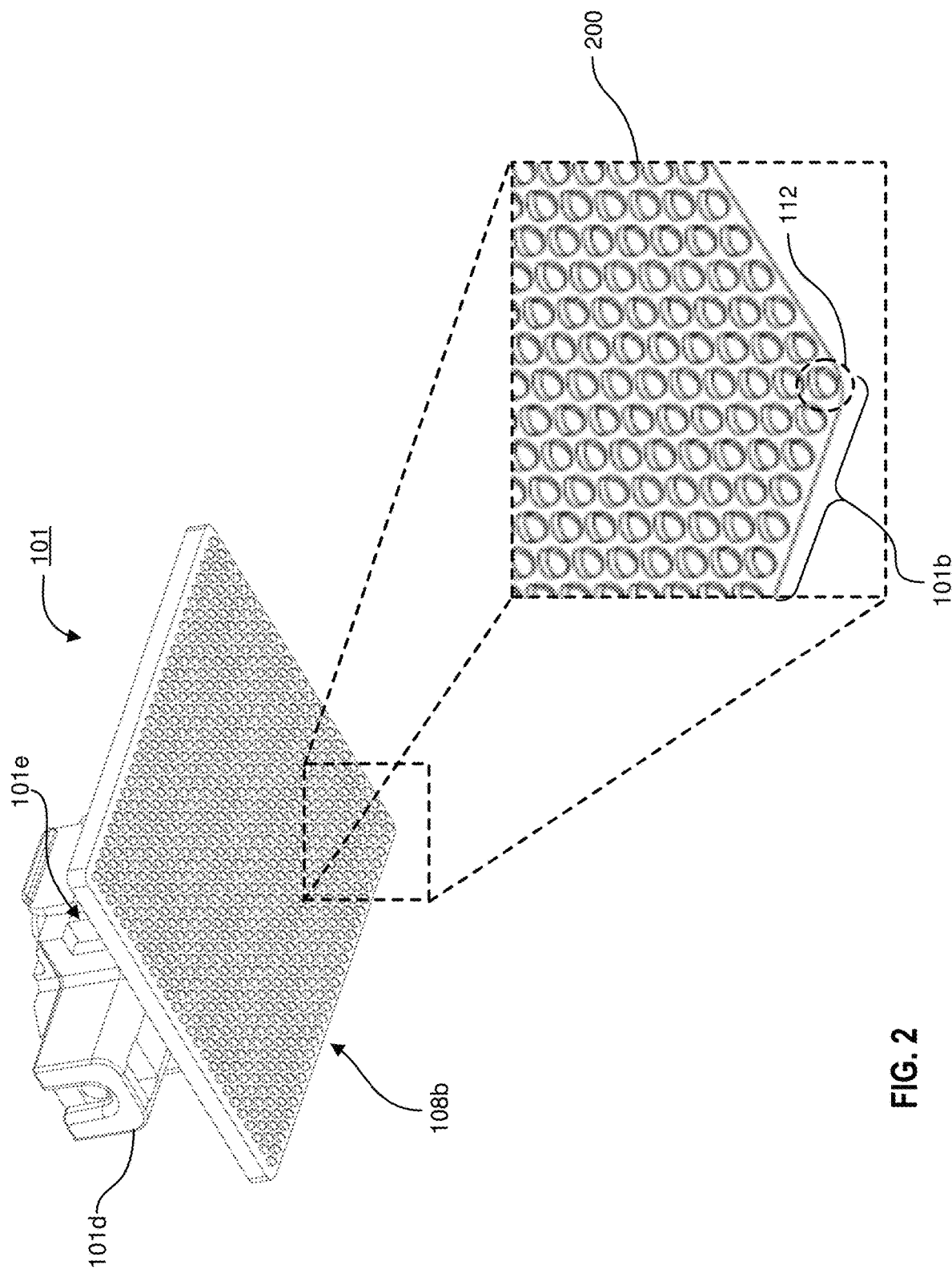
FIG. 2 illustrates an example MBO assembly with a ball grid array (BGA)-type electrical interface in accordance with embodiments of the technology disclosed herein.

As can be seen in FIGS. 1A and 1B, each of the components—soldered-down MBO assembly 101, interposer board 102, socket 103, and system board 104—all have the same electrical footprint. Each of MBO substrate ball array 101b, via grid array solder pad 102a, via grid array contact pad 102b, socket contact array 103a, socket contact ball array 103b, and MBO interface 104a are configured to have the same proportions as each other. By normalizing the size of each electrical footprint, embodiments of the present disclosure facilitate system board 104 to utilize a socketized configuration (as illustrated in FIGS. 1A-6B) or a soldered-down configuration (discussed in more detail with respect to FIGS. 2, 7A-7B, and 8B) without the need for modification of the layout of the system board. Maintaining the same footprint facilitates system board 104 design optimization because the size of each MBO interface 104a would not need to change to accommodate either the soldered-down or socketized approaches.

For socketized MBO configuration 100, socket 103 must be mounted on the surface of system board 104. This results in the design of electrical traces and the capacity of all components on system board 104 being impacted, wasting valuable real estate on system board 104 with connection points (e.g., mounting holes configured for a screw or bolt to be inserted), if each socket 103 were to have independent mounting holes when plurality of sockets 103 were disposed on system board 104. FIGS. 5A and 5B are exploded views of an example socketized MBO system 500 in accordance with embodiments of the present disclosure. Example socketized MBO system 500 is provided for illustrative purposes only and should not be limited solely to what is depicted. For ease of discussion, system board 104 is omitted from the illustration, but how system board 104 relates to the components of socketized MBO system 500 will be discussed with respect to FIGS. 6A and 6B. By implementing embodiments in accordance with the technology disclosed herein, more MBO assemblies may be included on the same system board, providing the ability for high-density deployments of socketized MBO assemblies (such as socketized MBO assemblies 120 identified in FIGS. 1A and 1B). Moreover, by ganging multiple socketized MBO configurations 100 together in the same socketized MBO system 500 the number of mounting holes required can be minimized, allowing greater flexibility in routing electrical traces within the system board. Shorter traces routed between socketized MBO and high-radix switch ASICs can improve high-speed signal performance.

As illustrated in FIGS. 5A and 5B, socketized MBO system 500 comprises a mounting housing comprising a stiffener plate 510 and a bolster plate 520. Stiffener plate 510 and bolster plate 520 may be configured to form a cavity within which one or more sets of socketized MBO assembly 120, interposer board 102, and socket 103 may be contained. In various embodiments, stiffener plate 510, in conjunction with the bolster plate 520, may be configured to provide a compressed force on the components within each socket instance 501, 502 to minimize warping of the system board, socket 103, or socketized MBO assembly 120. In various embodiments, socketized MBO system 500 may vary in the number of MBO assembly apertures. As a non-limiting example, in other embodiments socketized MBO system 500 may comprise one MBO assembly aperture (regardless of the impact on system board 104 resource usage rate), while in some embodiments socketized MBO system 500 may comprise a plurality of MBO assembly apertures. The number of socket instance 501, 502 may be dictated by the number of MBO interfaces (not shown in FIGS. 5A and 5B) needed for a particular design of the system board.

In various embodiments, stiffener plate 510 may include a plurality of attachment holes 511 through stiffener plate 510, configured to couple with corresponding spacers 521 disposed on a top surface of bolster plate 520. In various embodiments, attachment holes 511 may allow attachment elements (e.g., shoulder screws with springs—not shown in FIGS. 5A and 5B) to be attached at the top surface of stiffener plate 510. In various embodiments, spacers 521 can comprise threads for interfacing with an attachment element. Spacers 521 can have a height taller than the height of the system board (i.e., thickness of system board 104) but shorter than the combined height of the system board, socket, and interposer board to allow a gap between a top of spacer 521 and the bottom side 514 of stiffener plate 510. By including this gap, stiffener plate 510 is capable of being further compressed by the attachment of additional attachment elements to securely mate the socketized MBO assembly to the socket. Stiffener plate 510 includes bay openings 512 for each socket instance 501, 502, enabling stiffener plate 510 to interface with socketized MBO assembly 120 without hindering access to optical connectors 101d. In various embodiments, bay openings 512 may be configured with a indention 513 on a bottom side 514 of stiffener plate 510 configured to interface with the top surface of the interposer board within each socket instance 510, 520. Bolster plate 520 may be configured with an MBO interface opening 522 for each socket instance 501, 502. In various embodiments, MBO interface opening 522 enables access to the underside of MBO interface (i.e., system board pad array 104b shown in FIG. 1B) on the bottom surface of system board 104 (both not pictured in FIGS. 5A and 5B), facilitating installation of one or more additional circuit components to system board pad array 104b (e.g., decoupling capacitors).

In various embodiments, attachment holes 511 and spacers 521 may be configured to accept one of a variety of attachment elements (not shown in FIGS. 6A and 6B), including but not limited to screws, bolts or any other similar item used in the art for attaching devices and circuit boards. When inserted into attachment holes 511, the attachment elements may be configured to impart a compressed force on stiffener plate 510, this compressed force cascading through socketized MBO assembly 120, socket 103, and system board (not shown in FIGS. 6A and 6B). Spacers 521 may be configured such that the compressed force being applied is countered by the interaction of the attachment elements and spacers 521 in some embodiments, thereby keeping bolster plate 520 in the same position relative to stiffener plate 510. In other embodiments, this counter force may be applied by a nut or other attachment element disposed on the bottom each spacer 521 on the underside of bolster plate 520 and be configured to interact with the attachment elements passing through spacer 521.

FIG. 6A is a side view of an example socketized MBO configuration 100 when fully constructed in accordance with embodiments of the present disclosure. An expanded view of how the different components fit together is shown in FIG. 6B. As shown, socketized MBO assembly 120 (comprising soldered-down MBO assembly 101 and interposer board 102) mates with socket 103 at socket juncture 610. Spring contacts 402 are compressed by socketized MBO assembly 120, exerting a mating force on the contact pad on the bottom of interposer board 102 (i.e., contact pad 301b discussed with respect to FIG. 3). Socket juncture 610 forms a detachable electrical connection between socketized MBO assembly 120 and socket 103, facilitating a modular feature of the socketized MBO assemblies 120. Socket 103 is disposed on system board 104, with solder balls 112 on socket contact ball array 103b soldered to top surface of system board vias 104d of the MBO interface 104a. In various embodiments, system board vias 104d may be VIPPO vias, similar to VIPPO vias 310 discussed above with respect to FIG. 3. By utilizing VIPPO technology in MBO interfaces 104a reduces the impedance discontinuity in the system and further increases signal integrity and acceptable signal rates. In some embodiments, board vias 104d can comprise dog-bone vias. Bolster plate 520 supports system board 104. Due to the view, stiffener plate 510 is not illustrated in FIGS. 6A and 6B, however a person of ordinary skill in the art would understand in view of FIGS. 5A and 5B how stiffener plate 510 would interact with the rest of socketized MBO configuration 100.

Embodiments in accordance with the present disclosure provide many benefits over the current solutions for MBOs. Unlike traditional solutions, integrating VIPPO technology into socketized MBO assembly 102 provides increased signal integrity by moving the signal contact closer to the transmission medium (i.e., the via), unlike dog-bone and other via designed currently utilized with MBO installation. Embodiments of the present disclosure minimizes signal reflection by controlling the impedance of the interposer board and the socket to match with the soldered-down MBO and the system board, thereby minimizing impedance discontinuity points (e.g., each juncture where the signal moves from one dielectric media or component to another). Interposer board 102 impedance is controlled by selecting appropriate dielectric material and sizing via diameter and height, and add ground layers if necessary. By utilizing VIPPO technology in interposer board 102 and system board 104 minimizes the impedance discontinuity of the system and enable support for signal rates of greater than 25 Gbps/lane in various embodiments. By utilizing a thicker contact pad on the bottom side of each via, like contact pad 301b discussed above with respect to FIG. 3, VIPPO vias 310 are able to withstand the mating force applied by socket contacts, facilitating the use of VIPPO technology in a modular, socketized implementation.

Figure 8A:
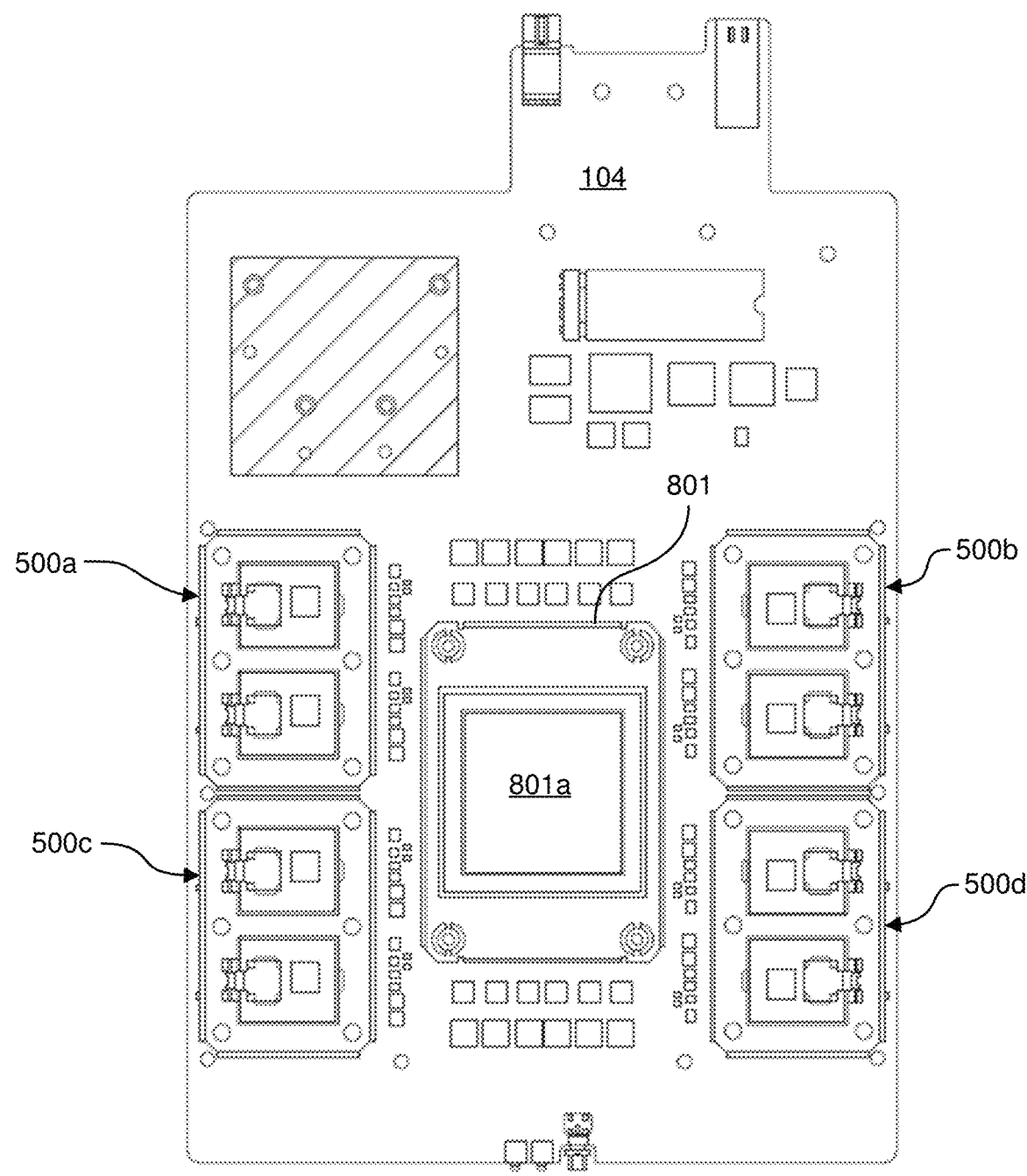
FIG. 8A illustrates an example system board assembly in accordance with embodiments of the technology disclosed herein.

Utilizing VIPPO technology, embodiments in accordance with the present disclosure reduce the surface area required for installing an MBO on a system board, like system board 104 described above with respect to FIGS. 1A and 1B. As discussed above, ganging multiple socketized MBO configurations 100 together in the same socketized MBO system 500 reduces the number of mounting holes required, allowing greater flexibility in routing electrical traces within the system board. This enables a high-density of MBOs to be located closer to a switch ASIC on system board 104. FIG. 8A shows a top-down view of an example universally-configurable system board assembly 800A comprising a plurality of socket instances in socketized MBO configuration 100 in accordance with embodiments of the present disclosure. Universally-configurable system board assembly 800A is for illustrative purposes only and should not be interpreted as limiting the scope of the technology discussed herein to the specific universally-configurable system board shape, MBO placement, or presence of additional circuit components shown in FIG. 8A.

As shown in FIG. 8A, universally-configurable system board assembly 800A includes a switch ASIC assembly 801 comprising a switch ASIC 801a disposed on the top surface of system board 104. In various embodiments, universally-configurable system board assembly 800A may comprise one or more switch ASIC assemblies 801. Each switch ASIC assembly 801 may comprise one or more switch ASICs 801a in various embodiments. Although illustrated as placed near the middle of system board 104, switch ASIC assembly 801 may be located anywhere on system board 104 as needed by the design constraints of the particular implementation. Socketized MBO systems 500a, 500b, 500c, 500d may be disposed on one or more edges of system board 104, or wherever MBO interfaces are provided on system board 104.

Each socketized MBO system 500a, 500b, 500c, 500d comprise two MBOs in a socketized MBO configuration, such as socketized MBO configuration 100 discussed with respect to FIGS. 1A, 1B, 2, 3, 4A, 4B, 5A, 5B, 6A, and 6B. Current modular solutions provide individual MBO modular connections, each having the same design of attachment holes, like attachment holes 511 discussed above with respect to FIGS. 5A and 5B. This requires greater spacing between MBO interfaces and additional mounting holes 104d (present underneath attachment holes 511). This further removes space on system board 104 that could be used to include additional circuit components and to route electrical traces. Utilizing socketized MBO systems 500a, 500b, 500c, 500d, each MBO interface 104a can be placed closer together on system board 104, enabling a higher number of MBO sockets to be supported. Moreover, the number of mounting holes 104d required are reduced. As illustrated in FIG. 8A, for socketized MBO system, two socketized MBO configurations 100 can be mounted to system board 104 with fewer mounting holes. With high-radix switch ASICs and a greater number of signals needing to be routed across system board 104, any system board 104 space which can be used is valuable. As a non-limiting example, if each socketized MBO configuration were to be mounted separately, four mounting holes 104d would be required to secure each instance, resulting in a total of 32 mounting holes 104d in system board 104 for eight instances. Utilizing socketized MBO systems 500a, 500b, 500c, 500d, only six mounting holes 104d would be necessary to mount two instances of socketized MBO, resulting in a total of 24 mounting holes 104d to mount the same number of instances, saving board space that otherwise would have been needed for the additional eight holes. In other embodiments, socketized MBO system 500 may be mounted utilizing fewer mounting holes 104d.

As discussed above, soldered-down MBO assembly 101 has the same electrical footprint as MBO interface 104a of system board 104, enabling system board 104 to also be configured in a soldered-down MBO configuration. FIGS. 7A and 7B illustrate an example soldered-down MBO configuration 700 in accordance with embodiments of the technology discussed herein. As shown in FIG. 7A, soldered-down MBO configuration 700 may comprise soldered-down MBO assembly 101 that is affixed (i.e., soldered down) onto system board 104. As illustrated in FIG. 7B, solder balls 112 of soldered-down MBO assembly 101 and the top contact pads of system board vias 104d are coupled at connection juncture 720.

Figure 8B:
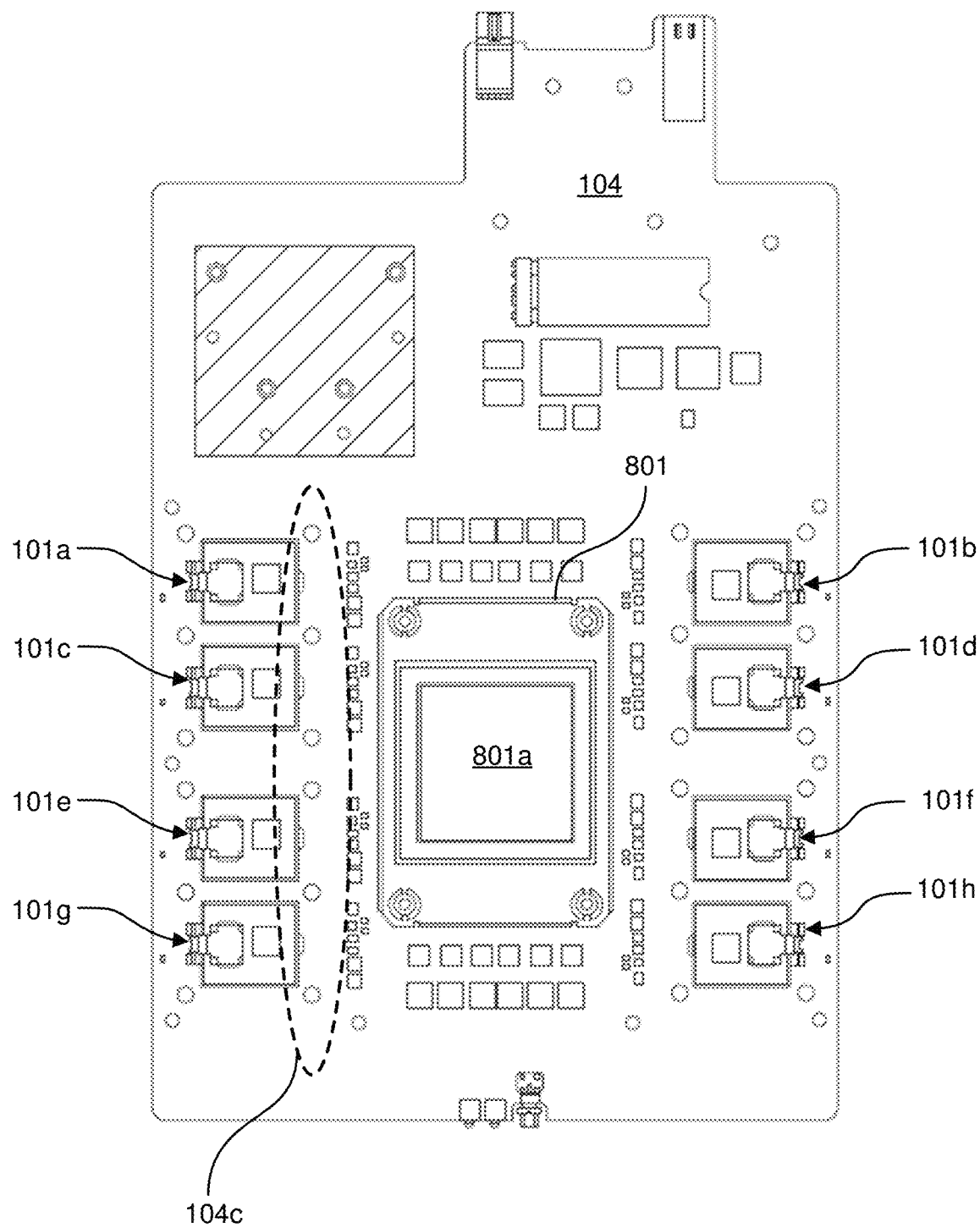
FIG. 8B illustrates another example system board assembly in accordance with embodiments of the technology disclosed herein.

FIG. 8B shows a top-down view of an example universally-configurable system board assembly 800B in a soldered-down MBO configuration 700 in accordance with embodiments of the present disclosure. Universally-configurable system board assembly 800B is for illustrative purposes only and should not be interpreted as limiting the scope of the technology discussed herein to the specific system board shape, MBO placement, or presence of additional circuit components shown in FIG. 8B. As illustrated in FIG. 8B, universally-configurable system board assembly 800B comprises the same system board 104 as discussed with respect to universally-configurable system board assembly 800A. Enabling the same system board to operate or work with both a socketized configuration or a soldered-down configuration reduces design costs, both economically (e.g., reducing the need for a plurality of different types of the same board for different customer requirements) and electrically (e.g., allowing for optimization of the electrical routing and density). Universally-configurable system board assembly 800B comprises a plurality of soldered-down MBO assemblies 101a-101h affixed to the top surface of system board 104, each soldered-down MBO assembly being communicatively coupled to switch ASIC 801a of switch ASIC assembly 800.

Although not utilized in the soldered-down configuration of universally-configurable system board assembly 800B, mounting holes 104d are visible on system board 104 because socketized MBO systems 500a, 500b, 500c, 500d are not present. Although not utilized, the mounting holes 104d do not adversely impact the electrical routing and functionality of soldered-down MBO configuration of universally-configurable system board assembly 800B because, unlike current approaches, system board 104 is designed to work equally in either configuration. In various embodiments, mounting holes 104d can be used to retain other devices, including but not limited to thermal devices, daughter cards, or other additional devices.

Figure 8C:
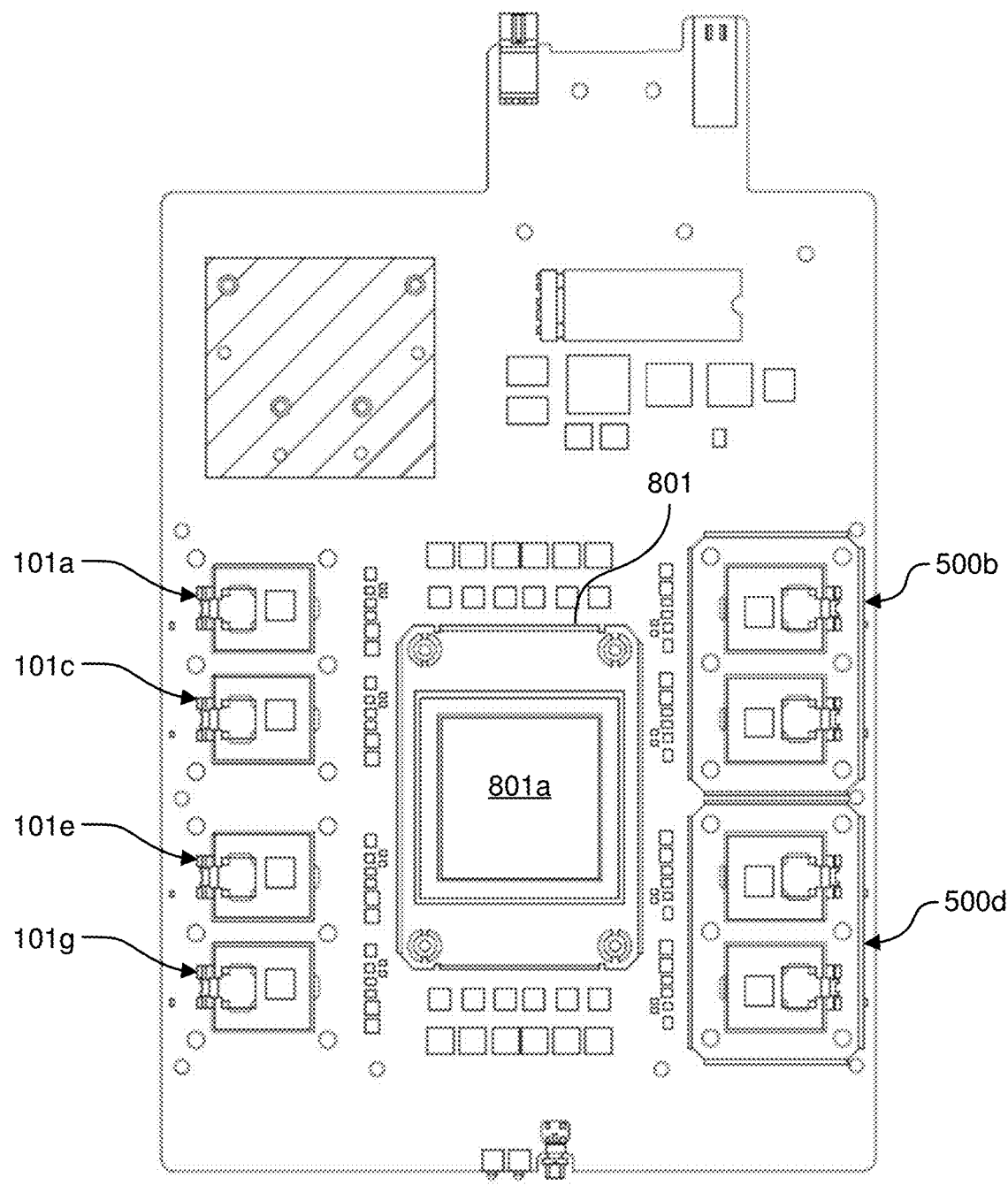
FIG. 8C illustrates another example system board assembly in accordance with embodiments of the technology disclosed herein.

In various embodiments, both configurations may be utilized in a system. FIG. 8C illustrates a non-limiting example of a combination universally-configurable system board assembly 800C in accordance with embodiments of the present disclosure. As illustrated in FIG. 8C, a plurality of soldered-down MBO assemblies 101a, 101c, 101e, 101g are disposed on one side of system board 104, and two socketized MBO systems 500b, 500d are disposed on the side opposite soldered-down MBO assemblies 101a, 101c, 101e, 101g. Although different configurations are present, the functionality of universally-configurable system board assembly 800C may not be different from either universally-configurable system board assembly 800A or 800B. Various embodiments may comprise different permutations of soldered-down MBO assemblies 101 and socketized MBO systems 500 distribution on system board 104.

As discussed above, embodiments of the technology disclosed herein provide an efficient high-density system board architecture compatible with a dual-use modular MBO. By eliminating the need to determine up front the type of MBO configuration to be used (i.e., soldered-down or socketized), the embodiments reduce the costs associated with system board design. Moreover, the embodiments provide flexibility in system board design because the electrical footprint of MBOs in either configuration are the same as the electrical footprint as MBO interfaces of the system board. By utilizing a socketized MBO system in accordance with the embodiments of the present disclosure, a high-density socketized system board is facilitated by reducing the amount of space required between sockets and the number of mounting holes.

Although discussed with respect to a system having a switch ASIC, a person of ordinary skill in the art would understand that the technology is applicable to connecting MBOs with any type of ASIC or processing component. The illustrative use of switch ASIC 801a should not be interpreted as limiting the scope of the technology disclosed herein only to switch implementations.

In common usage, the term "or" should always be construed in the inclusive sense unless the exclusive sense is specifically indicated or logically necessary. The exclusive sense of "or" is specifically indicated when, for example, the term "or" is paired with the term "either," as in "either A or B." As another example, the exclusive sense may also be specifically indicated by appending "exclusive" or "but not both" after the list of items, as in "A or B, exclusively" and "A and B, but not both." Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A system comprising:
    a universally-configurable system board comprising:
        a switch application specific integrated circuit (ASIC) assembly;
        a plurality of mid-board optic (MBO) interfaces electrically coupled to the switch ASIC assembly, each MBO interface comprising a plurality of via-in-pad plated over (VIPPO) vias; and
        a plurality of mounting holes configured for use in a socketized MBO configuration; and
    a plurality of MBO assemblies, each comprising an electrical interface portion, wherein a size of each MBO assembly electrical interface portion is the same as an electrical footprint of the MBO interfaces,
    wherein a layout of the universally-configurable system board is the same for both a soldered-down MBO configuration and a socketized MBO configuration.

2. The system of claim 1, wherein the plurality of MBO assemblies comprise a plurality of soldered-down MBO assemblies, each soldered-down MBO assembly comprising an MBO substrate comprising:
    an optical interface configured to be communicatively coupled to an optical connector
    a processing component; and
    the electrical interface portion of each soldered-down MBO assembly comprises a ball grid array (BGA) comprising a plurality of solder balls disposed on a bottom surface of the MBO substrate.

3. The system of claim 2, wherein each of the plurality of soldered-down MBO assemblies is associated with and affixed to one of the MBO interfaces, wherein affixing the soldered-down MBO assembly comprises soldering each solder ball of the BGA on the bottom surface of the MBO substrate to one of the plurality of VIPPO vias of the respective MBO interface.

4. The system of claim 1, wherein the plurality of MBO assemblies comprise a plurality of socketized MBO assemblies, each socketized MBO assembly comprising:
  an MBO substrate comprising:
    an optical interface configured to be communicatively coupled to an optical connector; and
    an MBO substrate electrical interface portion disposed on a bottom surface of the MBO substrate comprising a ball grid array (BGA) comprising a plurality of solder balls,
    wherein the MBO substrate electrical interface portion has a size that is the same as the electrical footprint of the MBO interfaces; and
  an interposer configured to communicatively couple with the BGA of the MBO substrate, the interposer comprising:
    a plurality of VIPPOS vias, each VIPPO via comprising a top contact pad with a first thickness disposed on a via grid array solder pad and a bottom contact pad with a second thickness disposed on a via grid array contact pad; and
    the via grid array solder pad and the via grid array contact pad each have a size that is the same as the electrical interface portion of the MBO substrate and the electrical footprint of the MBO interfaces,
  wherein each solder ball of the BGA of the MBO substrate is soldered to a top contact pad of a corresponding VIPPO via, and the second thickness is greater than the first thickness.

5. The system of claim 4, further comprising a plurality of sockets disposed on the universally-configurable system board, each socket associated with a one of the MBO interfaces and comprising a socket contact array comprising a plurality of socket contacts and a socket contact ball grid array comprising a plurality of solder balls, and wherein each socket is associated with a socketized MBO assembly to form a socket instance.

6. The system of claim 5, the socket contact array comprises a plurality of spring-type contacts, wherein the spring-type contact is configured to mate with the bottom contact pad of a VIPPO via of the via grid array contact pad of the interposer and the solder ball is configured to mate with a VIPPO via of the respective MBO interface.

7. The system of claim 5, wherein one or more socket instances are associated with a mount housing, the mount housing comprising:
  a stiffener plate disposed above each socketized MBO assembly of the one or more socket instances, the stiffener plate comprising one or more socket bays enabling access to the one or more socket instances and a plurality of attachment holes; and
  a bolster plate disposed below the universally-configurable system board, the bolster plate comprising a plurality of spacers, each spacer configured to insert into one of the mounting holes of the system board,
  wherein the plurality of attachment holes are aligned with the plurality of spacers and configured to connect stiffener plate and bolster plate.

8. The system of claim 7, wherein stiffener plate applies a compressed force on each socket instance to secure each socket instance and the universally-configurable system board against the bolster plate.

9. The system of claim 4, wherein a first set of the plurality of VIPPO vias are tied together and associated with a first power supply and a second set of the plurality of VIPPO vias are tied together and associated with a second power supply.

10. The system of claim 1, wherein the plurality of MBO assemblies comprise a first set of MBO assemblies and a second set of MBO assemblies, the first set of MBO assemblies comprising a plurality of MBO assemblies in the soldered-down MBO configuration and the second set of MBO assemblies comprising a plurality of MBO assemblies in the socketized MBO configuration.

11. A socketized mid-board optic (MBO) system comprising:
  two or more socket instances, each socket instance comprising:
    an MBO assembly comprising an optical interface configured to be communicatively coupled to an optical connector and an electrical interface portion comprising a ball grid array (BGA) comprising a plurality of solder balls;
    an interposer disposed below the MBO assembly and configured to communicatively couple to the BGA, the interposer comprising a plurality of via-in-pad plated over (VIPPO) vias, each VIPPO via comprising a top contact pad with a first thickness disposed on a via grid array solder pad and a bottom contact pad with a second thickness disposed on a via grid array contact pad;
    a socket disposed below the interposer and the MBO assembly and comprising a socket contact array comprising a plurality of socket contacts and a socket contact ball grid comprising a plurality of solder balls; and
    a mount housing comprising a stiffener plate and a bolster plate, the stiffener plate and the bolster plate configured to form a cavity, the two or more socket instances being within the cavity,
    wherein the electrical interface portion, the via grid array solder pad, the via grid array contact pad, the socket contact array, and the socket contact ball grid each comprising a size that is the same as an electrical footprint of an MBO interface of a universally-configurable system board, and the second thickness is greater than the first thickness.

12. The socketized MBO system of claim 11, each socket contact comprising a spring-type contact, wherein the spring-type contact is configured to mate with the bottom contact pad of a VIPPO via of the via grid array contact pad.

13. The socketized MBO system of claim 12, the socket contact array is configured to mate with the bottom contact pads of the plurality of VIPPO vias of the via grid array contact pad at a socket juncture, the socket juncture forming a detachable electrical connection.

14. The socketized MBO system of claim 11, the stiffener plate comprising one or more socket bays enabling access to the one or more socket instances and a plurality of attachment holes.

15. The socketized MBO system of claim 14, the bolster plate comprising a plurality of spacers, wherein the plurality of spacers and the plurality of attachment holes are aligned and configured to secure the two or more socket instances within the mount housing.

16. The socketized MBO system of claim 11, the interposer further comprising one or more assembly alignment features, the socket comprises one or more assembly alignment protrusions, wherein each one of the one or more assembly alignment features is configured to interface with one or the one or more assembly alignment protrusions.

17. The socketized MBO system of claim 11, the bolster plate further comprising an MBO interface opening configured to enable access to an underside of the universally-configurable system board.

18. A universally-configurable system board comprising:
- a switch application specific integrated circuit (ASIC) assembly; and
- a plurality of mid-board optic (MBO) interfaces electrically coupled to the switch ASIC assembly;
- wherein a layout of the universally-configurable system board is the same for both a soldered-down MBO configuration and a socketized MBO configuration.

19. The system board of claim 18, further comprising a plurality of MBO assemblies, the plurality of MBO assemblies comprising a soldered-down MBO configuration, a socketized MBO configuration, or a combination thereof.

20. The system board of claim 18, further comprising a plurality of mounting holes configured for use in the socketized MBO configuration utilizing a socketized MBO assembly.

* * * * *